(12) United States Patent
Zhang

(10) Patent No.: US 7,331,700 B2
(45) Date of Patent: Feb. 19, 2008

(54) HIGH INTENSITY UTILITY LIGHT

(75) Inventor: Long Bao Zhang, Orange, CA (US)

(73) Assignee: A L Lightech, Inc., Orange, CA (US)

( * ) Notice: Subject to any disclaimer, the term of this patent is extended or adjusted under 35 U.S.C. 154(b) by 39 days.

(21) Appl. No.: 11/151,824

(22) Filed: Jun. 13, 2005

(65) Prior Publication Data

US 2005/0270780 A1 Dec. 8, 2005

Related U.S. Application Data

(63) Continuation-in-part of application No. 10/714,263, filed on Nov. 14, 2003, now Pat. No. 6,922,018.

(51) Int. Cl.
*F21V 29/00* (2006.01)
(52) U.S. Cl. .................. 362/800; 362/294; 315/112
(58) Field of Classification Search ............. 362/294, 362/545, 800, 555; 315/76, 112, 113
See application file for complete search history.

(56) References Cited

U.S. PATENT DOCUMENTS

| | | | | |
|---|---|---|---|---|
| 5,924,787 | A * | 7/1999 | McEllen et al. | 362/263 |
| 6,702,452 | B2 * | 3/2004 | Jigamian et al. | 362/205 |
| 7,015,514 | B2 * | 3/2006 | Baur et al. | 257/100 |
| 7,210,832 | B2 * | 5/2007 | Huang | 362/547 |
| 2004/0051106 | A1 * | 3/2004 | Baur et al. | 257/79 |

* cited by examiner

*Primary Examiner*—Douglas W. Owens
*Assistant Examiner*—Jimmy Vu
(74) *Attorney, Agent, or Firm*—Raymond Y. Chan; David and Raymond Patent Group

(57) ABSTRACT

The present invention discloses a high intensity light source arrangement, which includes a luminary unit having a luminary unit, at least a terminal electrically connected to the luminary circuit, and at least a luminary element electrifying with the terminal for emitting light, a heat dissipation unit which dissipates heat generated from the luminary unit, and a base housing which comprises an electric input connector electrically connected to the luminary unit.

13 Claims, 23 Drawing Sheets

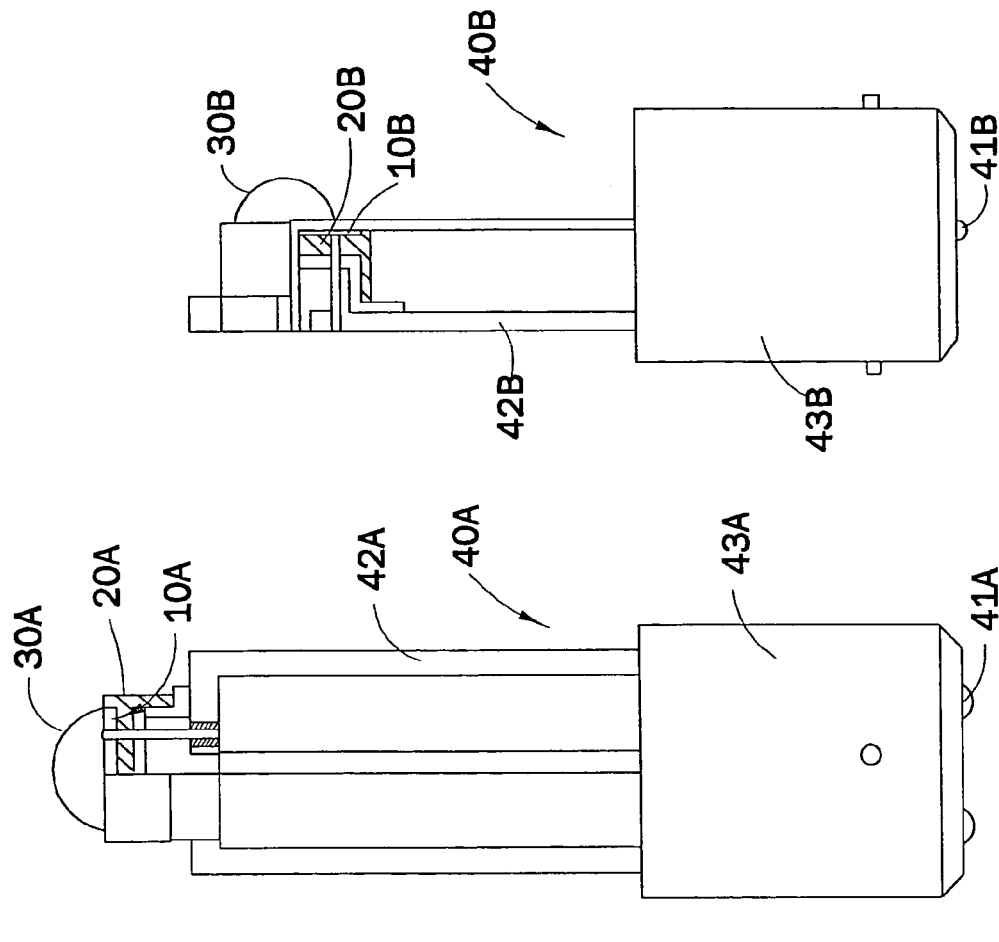
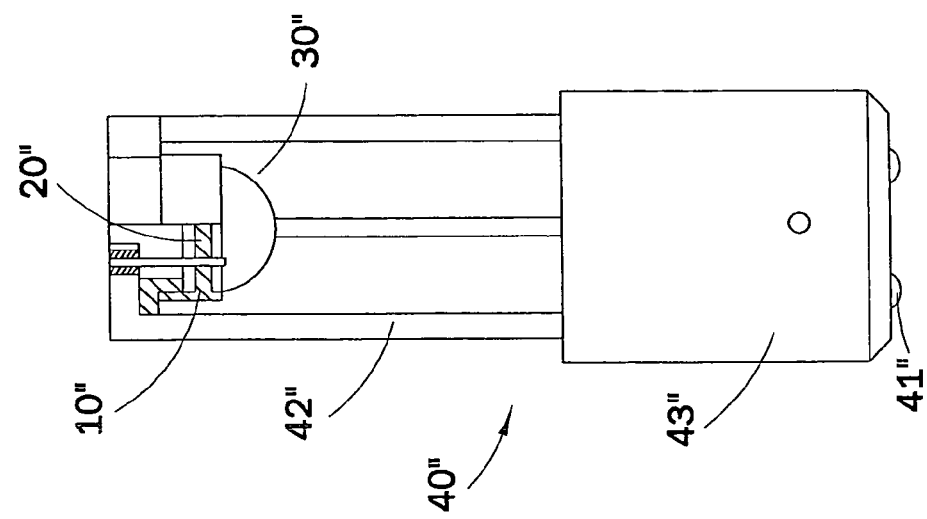

HIGH INTENSITY UTILITY LIGHT

CROSS REFERENCE OF RELATED APPLICATON

This is a CIP of a non-provisional Application having an application Ser. No. 10/714,263 now U.S. Pat. 6,922,018 and filing date of Nov. 14, 2003.

BACKGROUND OF THE PRESENT INVENTION

1. Field of Invention

The present invention relates to a light source arrangement, and more particularly to a high intensity light source arrangement which can enhance brightness of emitting light and increase the cooling effect of the light source arrangement while using low current and voltage.

2. Description of Related Arts

Nowadays, the most common light sources are filament lamp bulb for illumination and LED lighting for indication. Due to the remarkable features of low power consumption and instant light emission, LED lighting is specially adapted to be utilized in many electrical appliances as signal and indicating lighting, such as the power on-off signal light and instructional signal light of electric equipment, indicating light of electronic clock, and etc.

Although the LED has excellent properties of low power consumption and instant light emission, the relatively small light intensity and lighting emission angle of the LED make it not suitable to use for illumination or even apply in some specific area such as traffic light, signboard light, vehicle brake light and signal light, and airport guiding lighting.

In order to increase the light intensity of the LED, a larger current can be applied to the LED so as to increase the electrical power thereof. However, due to the structure of the LED, when increasing the current, heat generated from the LED will burn the LED.

In addition, the major drawback of the LED is that the LED cannot produce white light. It is known that white light is composed of red, blue, and green lights. A single LED is capable of producing red, blue, and green lights individually but not the daily used white light.

In order to produce a white light, an improved LED comprises a blue zinc luminary element and a fluorescent layer powdered on an inner surface of a reflexive cover, wherein when light is produced by the luminary element and reflexed on the fluorescent layer, the white light is produced. However, the fluorescent layer cannot be evenly applied on the inner surface of the reflexive cover so that the white light will not be evenly dispersed from the reflexive cover so as to provide an uneven intensity of the white light.

SUMMARY OF THE PRESENT INVENTION

A main object of the present invention is to provide a high intensity light source arrangement which can prolong the service life span of the high intensity light source arrangement by better dissipating and reducing the heat generated.

Another object of the present invention is to provide a high intensity light source arrangement which greatly increases the brightness of the light emitted, wherein the light source arrangement is capable of providing a light intensity up to five times or more of a conventional LED.

Another object of the present invention is to provide a high intensity light source arrangement which comprises a heat dissipation unit directly mounted underneath a circuit board for efficiently dissipating heat therefrom. Therefore, a plurality of luminary elements is capable of electrifying with the terminals on the circuit board.

Another object of the present invention is to provide a high intensity light source arrangement adapted for producing a white light by selectively arranging the luminary elements of the luminary unit.

Another object of the present invention is to provide a high intensity light source arrangement adapted for selectively controlling the color of the light from the luminary unit.

Another object of the present invention is to provide a high intensity light source arrangement wherein a fluorescent layer is evenly coated on an inner surface of a head cover of the high intensity so as to enhance the white light evenly dispersed therefrom.

Another object of the present invention is to provide a high intensity light source arrangement wherein conventional LED light source could be defined onto a curved or even spherical shaped interface so as to ultimately enhance the light source utilization ratio.

Another object of the present invention is to provide a high intensity light source arrangement comprising a converging element to diverge high-intensity light beams from a light source in 360° direction.

Another object of the present invention is to provide a high intensity light source arrangement which comprises a heat transfer arrangement comprising a heat sink for substantially dissipating the heat from the light source in an effective manner.

Another object of the present invention is to provide a high intensity light source arrangement which comprises a heat transfer arrangement comprising a cooling agent contained in a sealed chamber for substantially dissipating the heat from the light source through the phase equilibrium process of the cooling agent.

Accordingly, in order to accomplish the above objects, the present invention provides a high intensity light source arrangement, comprising:

a luminary unit comprising a luminary circuit, at least a terminal electrically connected to the luminary circuit, and at least a luminary element adapted for electrifying with the terminal to emit light;

a heat dissipation unit supporting the luminary unit and dissipating heat generated from the luminary unit; and a base housing for supporting the heat dissipation unit thereon comprising an electric input connector electrically connecting to the luminary unit.

These and other objectives, features, and advantages of the present invention will become apparent from the following detailed description, the accompanying drawings, and the appended claims.

BRIEF DESCRIPTION OF THE DRAWINGS

FIG. 9 is a partially sectional view of a high intensity light source arrangement according to a third preferred embodiment of the present invention.

FIG. 10 is a partially sectional view of a first alternative mode of the high intensity light source arrangement according to the above third preferred embodiment of the present invention.

FIG. 11 is a partially sectional side view of a second alternative mode of the high intensity light source arrangement according to the above third preferred embodiment of the present invention.

DETAILED DESCRIPTION OF THE PREFERRED EMBODIMENT

Figure 1:
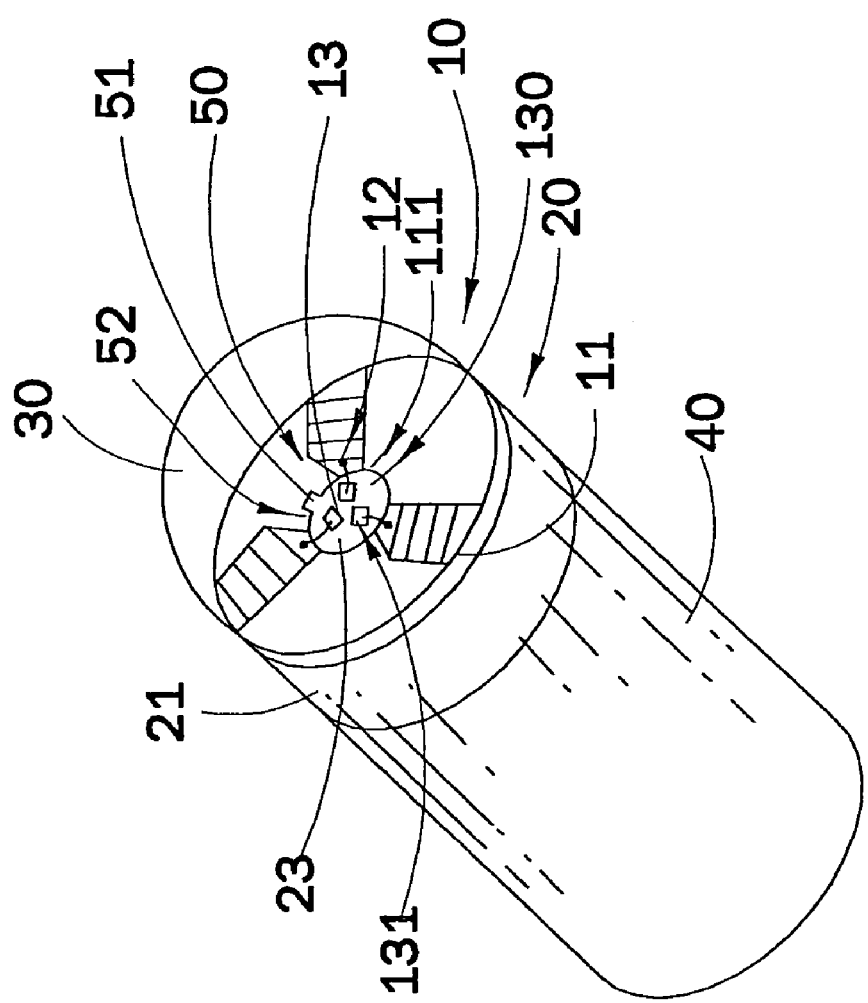
FIG. 1 is a perspective view of a high intensity light source arrangement according to a first preferred embodiment of the present invention.
Figure 2:
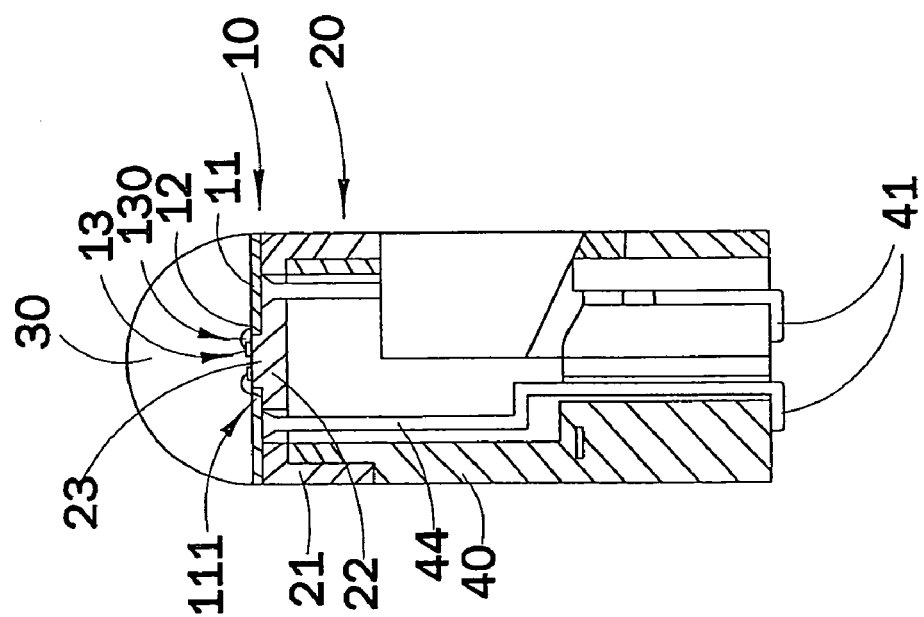
FIG. 2 is a partial section view of the high intensity light source arrangement according to the above first preferred embodiment of the present invention.

Referring to FIGS. 1 and 2 of the drawings, a high intensity light source arrangement according to a first preferred embodiment of the present invention is illustrated. The high intensity light source arrangement comprises a luminary unit 10, a heat dissipation unit 20 and a base housing 40.

The luminary unit 10 comprises a luminary circuit 11 which can be a circuit board or a printed circuit film, at least a terminal 12 electrically connected to the luminary circuit 11, and at least a luminary element 13 adapted for electrifying with the terminal 12 to emit light.

The heat dissipation unit 20 supports underneath the luminary unit 10 for directly dissipating heat generated from the luminary unit 10. A transparent head shelter 30 is mounted on the luminary unit 10 in an airtight manner. The base housing 40 which connects to the heat dissipation unit 20 comprises an electric input connector 41 electrically connecting to the luminary unit 10, as shown in FIG. 2.

According to the first preferred embodiment, the luminary circuit 11 of the luminary unit 10 is made in ring shape that has a center through hole 111. Also, the luminary circuit 11 has three or more terminals 12 provided thereon, as shown in FIG. 1.

The heat dissipation unit 20 comprises a circular ring body 21, a ceiling wall 22 integrally formed at a top end of the ring body 21 and a circular supporting platform 23 integrally projected from a center position of the ceiling wall 22 of the heat dissipation unit 20.

The luminary unit 10 securely sits on the ceiling wall 22 of the heat dissipation unit 20 by fittedly inserting the supporting platform 21 into the center through hole 111 of the luminary circuit 11, wherein the bottom surface and the inner circumferential side of the luminary unit 10 are well contact with the top surface and the outer circumferential side of the ceiling wall 22 of the heat dissipation unit 20, so that the heat generated from the luminary unit 10 is capable of directly dissipating from the heat dissipation unit 20 to outside so as to increase the cooling effect of the luminary unit 10. In other words, the contact area between the luminary circuit 11 and the heat dissipation unit 20 is increased so as to enhance the cooling effect of the heat dissipation unit 20 for dissipating heat for the luminary unit 10. Moreover, the extended ring body 21 of the heat dissipation unit 20 not only provides a solid connection with the base housing 40 but also substantially increases the heat dissipating area with the outside environment to further increase the heat dissipating effect.

It is worth to mention that when each of the luminary elements 13 is electrified with the respective terminal 12, the luminary element 13 not only emits light but also generates heat that may burn off the luminary element 13 itself while the luminary element 13 is overheated. Since the luminary elements 13 are directly supported on the supporting platform 21, the heat from the luminary elements 13 is capably of directly transferring and dissipating to the heat dissipation unit 20 and better preventing the luminary elements 13 from overheating.

The head shelter 30 is securely mounted on the heat dissipation unit 20 in an airtight manner wherein the luminary unit 10 is protected by the head shelter 30 for resisting shock and vibration. The head shelter 30 is a semi-spherical shaped transparent body protruded from the luminary unit 10 and the luminary elements 13 are positioned at a center of the head shelter 30 such that the light could be evenly distributed to an exterior of the head shelter 30, wherein the light from the luminary unit 10 is adapted for passing through the head shelter 30 to outside. Accordingly, the head shelter 30 is made by molding a semi-spherical shape of transparent material having high thermo-resistance ability, such as transparent epoxy resin, on the luminary unit 10 and the supporting platform 23 that integrally joins the luminary unit 10, the heat dissipation unit 20 and the head shelter 30 to form an integral body.

The base housing 40 is a hollow body that securely supports the heat dissipation unit 20 thereon, wherein connectors 44 are electrically extended from the luminary unit 10 to a pair of electric input connectors 41 provided at a bottom portion of the base housing 40 for electrically connecting the luminary unit 10 with a power supply device.

As shown in FIG. 1, the high intensity light source arrangement further comprises a guiding means 50 for securely mounting the luminary unit 10 on the heat dissipation unit 20 in position wherein the guiding means 50 comprises a guiding latch 51 which is vertically projected from a side edge of the supporting platform 21 of the heat dissipation unit 20 and arranged to fit into a guiding groove 52 formed on the inner circumferential side of the center through hole 111 of the luminary circuit 11 in such a manner that the luminary elements 13 on the supporting platform 21 are aligned with the terminals 12 respectively for electrified.

It is worth to mention that each luminary element 13 can produce at least the same amount of light intensity of a conventional LED. Since when a plurality of the luminary elements 13 are gathered together, multiple amount of heat will be generated that may cause a conventional LED structure to burn out. However, since the plurality of the luminary elements 13 are supported on the supporting platform 21 of the heat dissipation unit 20, the heat from the luminary elements 13 as well as the luminary unit 10 is directly transferred to the heat dissipation unit 20 for preventing the luminary elements 13 and the luminary unit 10 from being overheated. Therefore, the luminary unit 10 of the high intensity light arrangement can multiple the light intensity by providing a plurality of luminary elements 13 without burning off the luminary unit 10.

Accordingly, it is possible to have three different kinds of luminary elements 13 attached on the supporting platform 23 of the heat dissipation unit 20 and electrically connected with the three terminals 12 respectively for producing different colors of light such as red, blue, or green.

According to the first preferred embodiment of the present invention, the three luminary elements 13, which are made of different materials, are adapted for producing red, green, and blue colors of light respectively, wherein the distance between the three luminary elements 13 is minimized to form a lighting spot 130 so that the red, green, and blue lights produced at the same time form the white light.

Figure 4:
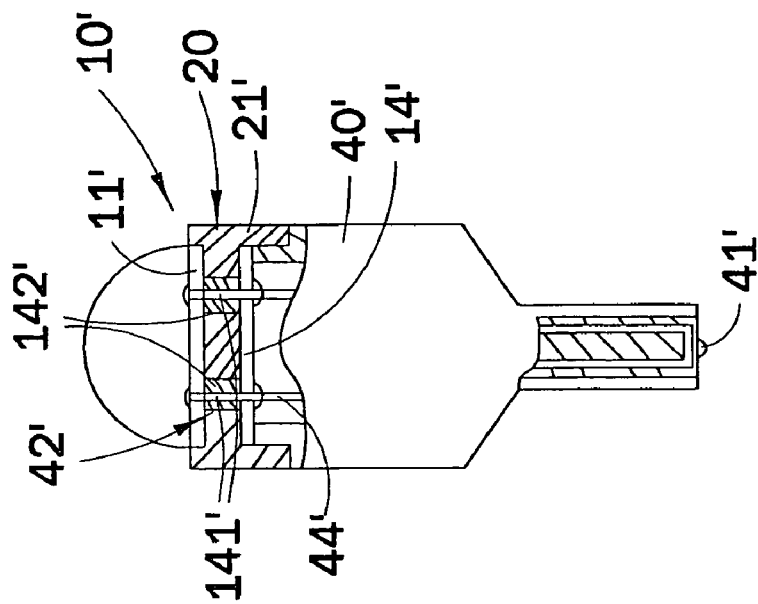
FIG. 4 is a partial section view of the alternative mode of the high intensity light source arrangement according to the above first preferred embodiment of the present invention.
Figure 3:
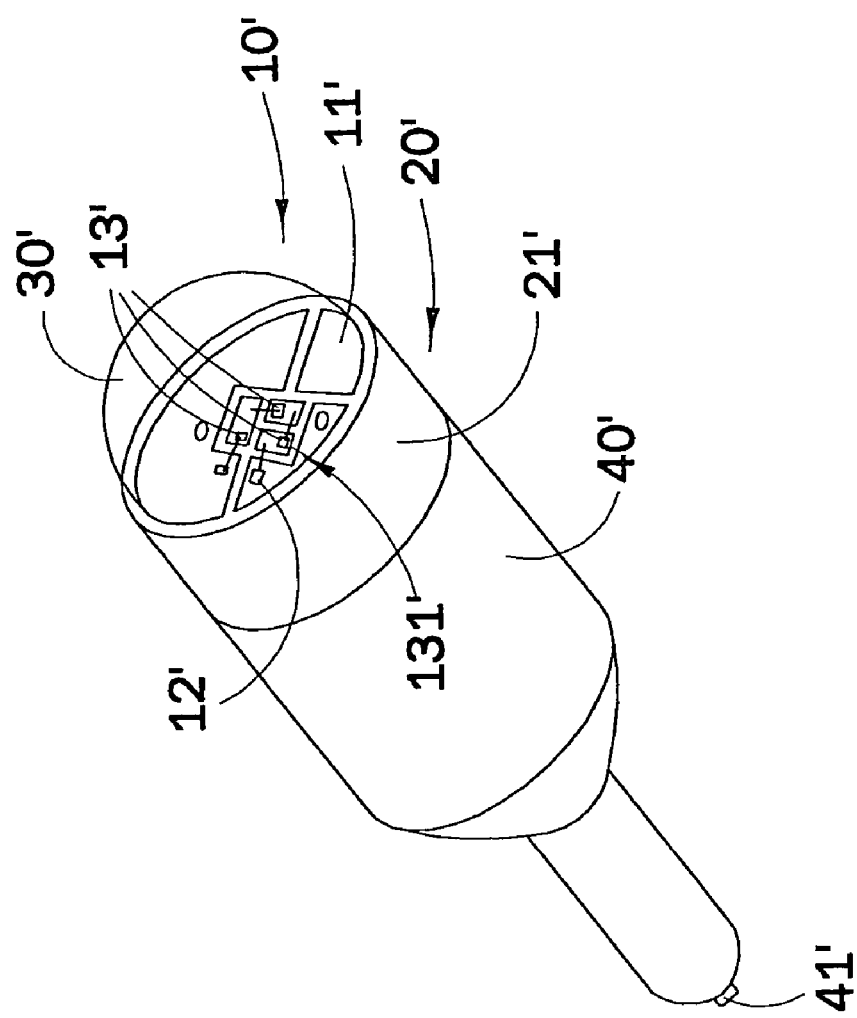
FIG. 3 is a perspective view of an alternative mode of the high intensity light source arrangement according to the above first preferred embodiment of the present invention.

FIGS. 3 and 4 illustrates an alternative mode of the high intensity light source arrangement according to the above first preferred embodiment of the present invention, wherein the luminary circuit 11' of the luminary unit 10' is a circuit board or a printed circuit film having a circular shape firmly attached to a flat top side the ceiling wall 22' of the heat dissipation unit 20', wherein since the luminary unit 10' is alternatively embodied as a complete circular piece, no supporting platform 23 is provided on the ceiling wall 22' according to this alternative mode.

The luminary circuit 11' comprises isolating diodes and three luminary elements 13' connected to a center portion of the luminary circuit 11' to electrify with the respective terminals 12' positioned closed to the luminary elements 13'. The luminary unit 10' further comprises an auxiliary luminary circuit 14', as shown in FIG. 4, which is firmly attached to a bottom side of the ceiling wall 22' of the heat dissipation unit 20', containing resistors to electrically connect with the luminary circuit 11' by means of conduction rivets 141' which connect the upper luminary circuit 11' with the lower auxiliary luminary circuit 14' through the ceiling wall 22' of the heat dissipation unit 20' via the respective insulation sleeves 142' provided in the ceiling wall 22'.

In other words, for securely mounting the luminary unit 10' on the heat dissipation unit 20', two or more through holes 42' penetrate through the ceiling wall 22' of the heat dissipation unit 20', wherein the insulation sleeves 142' are inserted in the through holes respectively. The conduction rivets 141' penetrate through the insulation sleeves 142' respectively for both physically and electrically connecting the luminary circuit 11' with the auxiliary luminary circuit 14' to the heat dissipation unit 20'. Thus, connectors 44' are electrically extended from the conduction rivets 141' so as to electrically connect the luminary unit 10' to the electric input connector 41' of the base housing 40'. Similarly, the heat generated from the luminary circuit 11' and the auxiliary luminary circuit 14' will be transferred to the heat dissipation unit 20'. Like the first preferred embodiment, a semi-spherical transparent head shelter 30' also covers the luminary unit 10' in an airtight manner.

According to the first preferred embodiments of the present invention, the luminary circuit 11 or the luminary circuit 11' and the auxiliary luminary circuit 14' should be made of good conductive material for conducting heat generated therefrom to the heat dissipation unit 20, 20' for heat dissipation without overheating the luminary unit 10, 10'.

Figure 7:
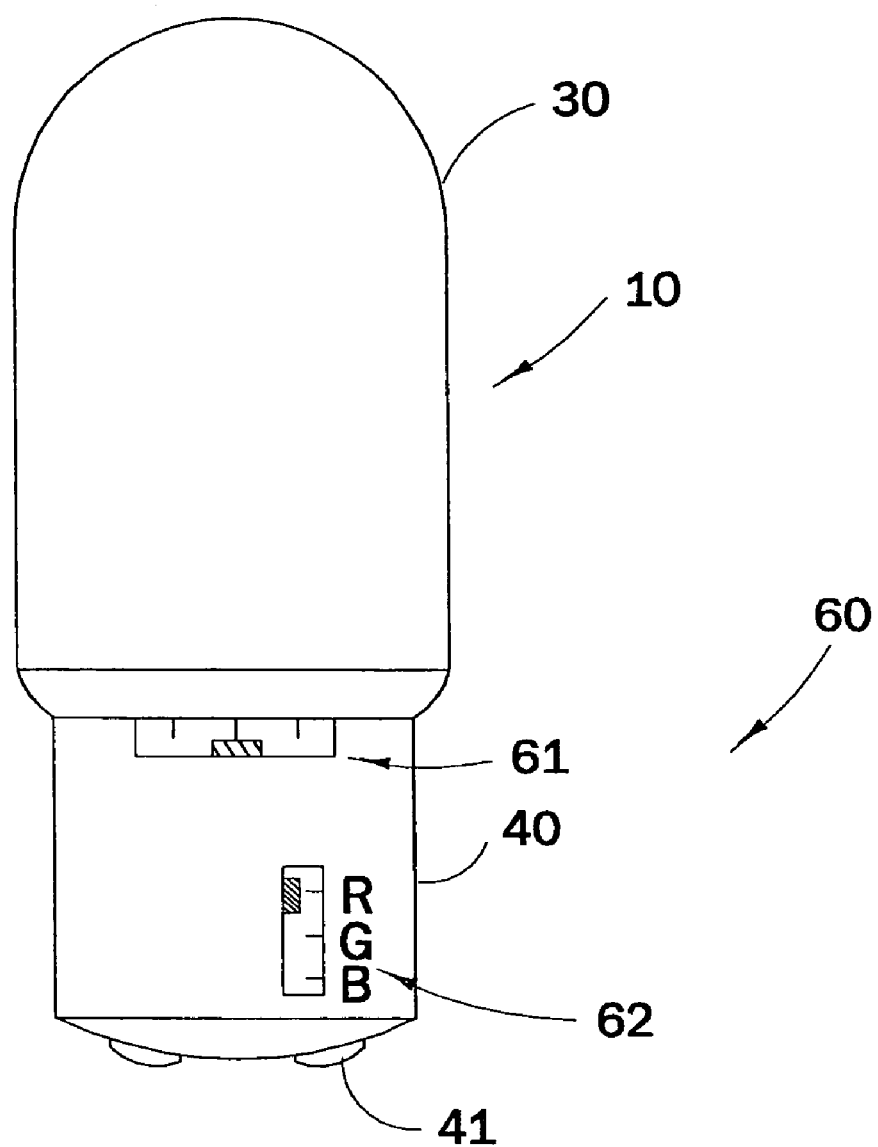
FIG. 7 illustrates a controlling device incorporated with the high intensity light source arrangement according to the above first preferred embodiment of the present invention.

FIG. 7 shows an alternative appearance of the high intensity light source arrangement of the present invention, wherein it further comprises a controlling device 60 for selectively controlling a flow of current passing to the luminary unit 10, as shown in FIG. 7, so as to adjust the light intensity of the luminary unit 10 and select the color of the light of the luminary unit 10. The controlling device 60, which is provided on the base housing 40, comprises a light control switch 61 for adjustably controlling the light intensity of the luminary unit 10 and a color control switch 62 for selecting the color of the light by selecting the red, blue or green luminary element 13 to produce predetermined color of light, such as red, blue or green.

Figure 5C:
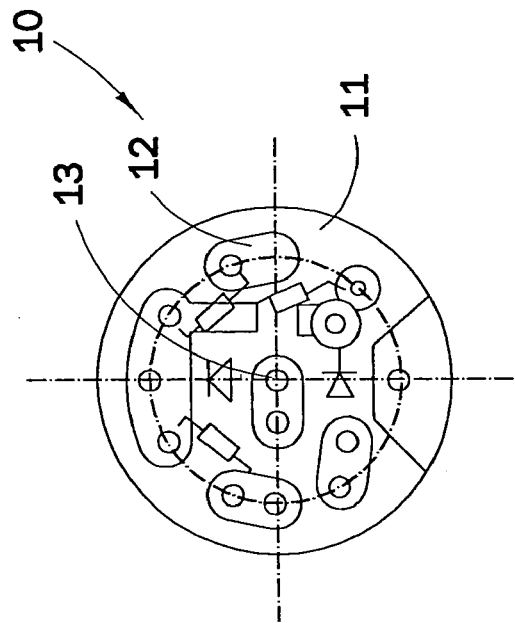
FIGS. 5A to 5C illustrate different-circuits of the luminary unit of the high intensity light source arrangement according to the above first preferred embodiment of the present invention.
Figure 5B:
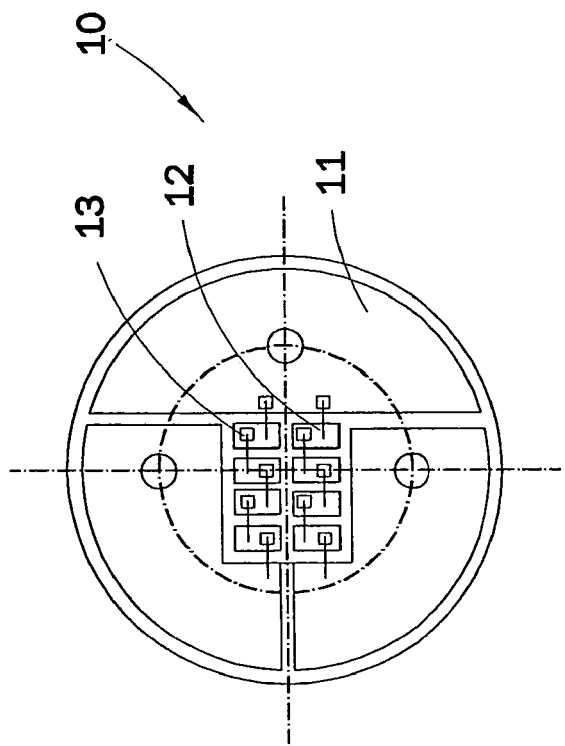
Figure 5A:
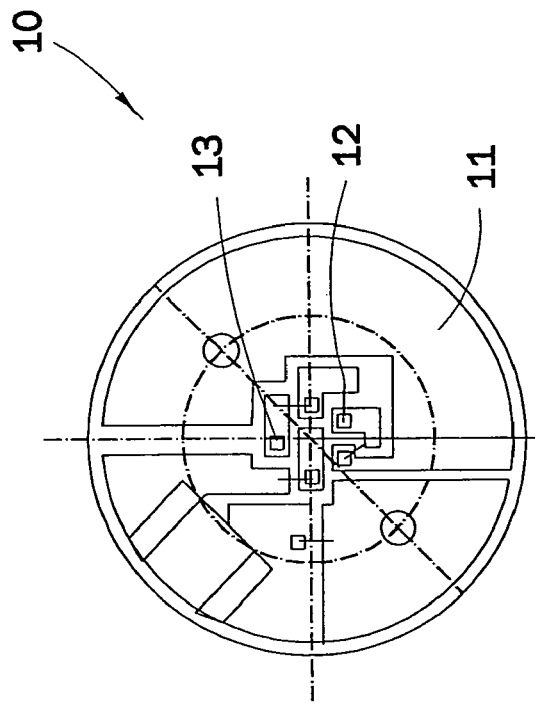

As shown in FIGS. 5A to 5C, for controlling the light and color by the controlling means 60 of the present invention, different arrangements of the luminary elements 13' according to the alternative mode of the above first preferred embodiment are illustrated, wherein the luminary elements 13' are electrically arranged in a specific connection on the luminary circuit 11', so as to selectively electrified with the terminals 12' for producing different colors of light and increasing the light intensity of the luminary unit 10'.

Figure 6A:
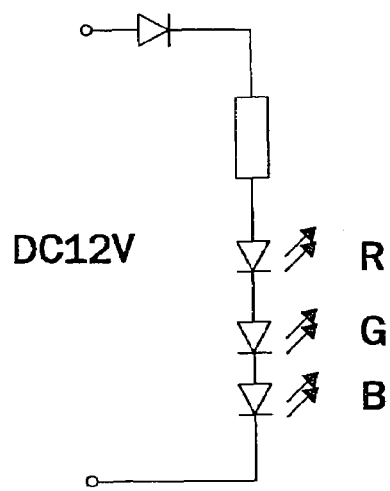
FIGS. 6A to 6E are circuit diagrams of the luminary unit of the high intensity light source arrangement according to the above first preferred embodiment of the present invention.

According to the above first preferred embodiment and its alternative mode, for producing the white light, at least a set of three luminary elements 13 or 13' which produce red, green, and blue light respectively are connected in a serial connection in such a manner that the luminary elements 13 or 13' are electrified with the terminals 12 or 12' respectively at the same time, as shown in FIG. 6A.

Figure 6B:
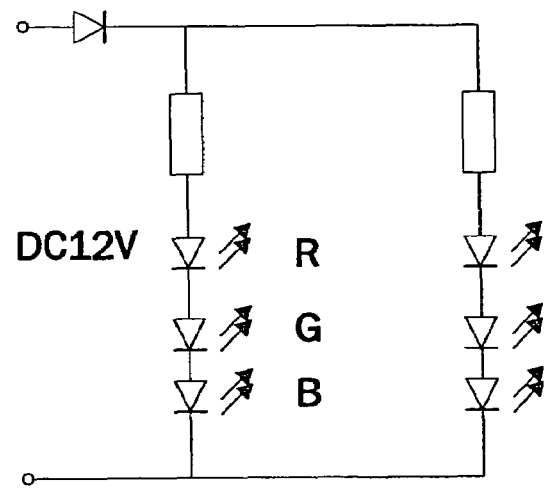

In order to increase the light intensity of the luminary unit 10, as shown in FIG. 6B, more than one set of red, blue green luminary elements 13 or 13' are provided and electrically connected in a parallel connection in such a manner that the light intensity of the luminary unit 10 or 10' is capable of selectively controlling by a predetermined current passing through each set of luminary elements 13 or 13'.

Figure 6C:
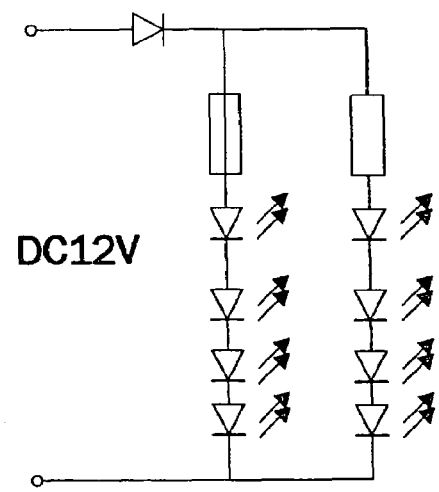
Figure 6D:
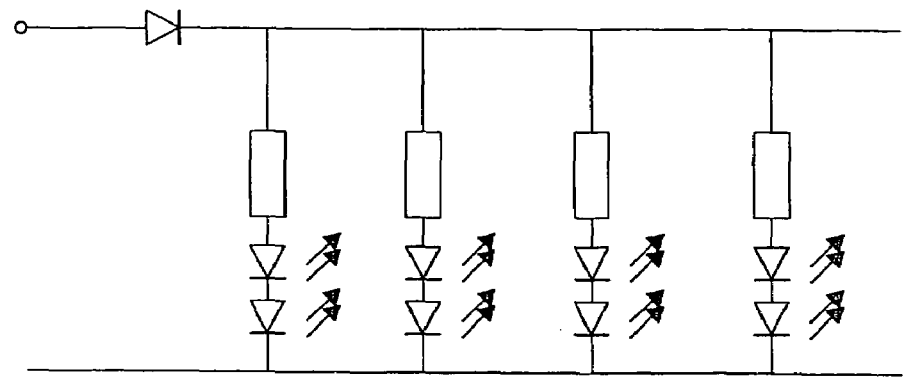
Figure 6E:
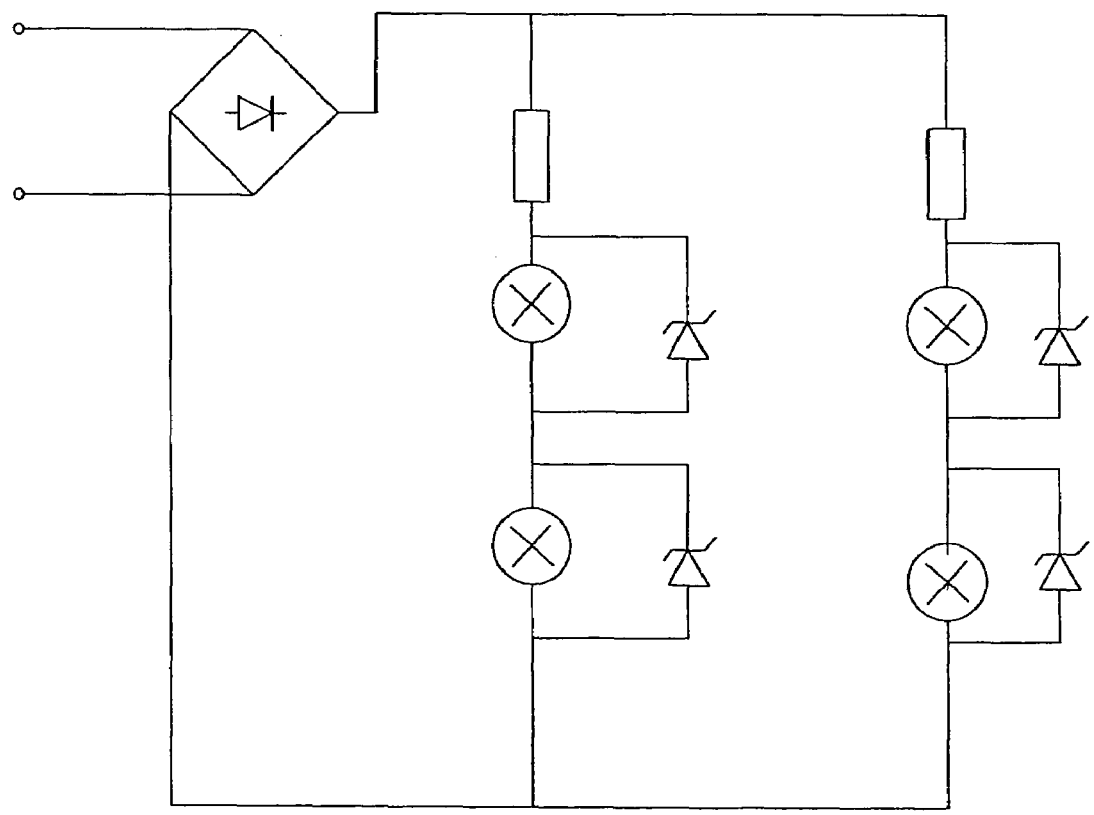

As shown in FIGS. 6C through 6E, by selectively arranging the luminary elements 13 or 13' in both serial and parallel connections for adjustably increasing the light intensity of the luminary unit 10 or 10', wherein in each set of luminary elements 13 or 13' which are made of same material, the luminary elements 13 or 13' are connected in the serial connection and adapted for producing a predetermined amount of light intensity. Thus, the predetermined sets of luminary elements 13 or 13' are connected in the parallel connection for increasing the light intensity of the luminary unit 10 or 10' by varying the current passing through the luminary circuit 11 or 11'.

In other words, by connecting the luminary elements 13 or 13' in the serial connection, the luminary unit 10 or 10' can produce a predetermined amount of light intensity when the luminary elements 13 or 13' are made of same material and a white light when the luminary elements 13 or 13' are made of different materials adapted for producing red, green, and blue colors respectively. When the luminary elements 13 or 13' are connected in a parallel connection, the luminary unit 10 or 10' is capable of adjusting the light intensity thereof.

Alternatively, in order to produce a white light according to the above first preferred embodiment and its alternative mode, a fluorescent layer 131 is evenly coated on an outer surface of the blue light luminary elements 13 or 13', as shown in FIGS. 1 and 2, in such a manner that when the luminary elements 13 are electrified with the terminals 12 to produce the blue light which is then reflexed on the fluorescent layer 131 to form the white light. Accordingly, the fluorescent layer 131 is formed by a predetermined amount of fluorescent powder evenly adhered on the outer surface of the luminary element 13. Practically, water dissolvable chemical adhesive can be applied to adhere the fluorescent powder on the luminary element 13 or 13'. Afterwards, water content in the adhesive can be vaporized by heat so as to integrally adhere the fluorescent powder on the luminary element 13 or 13' permanently.

Figure 8:
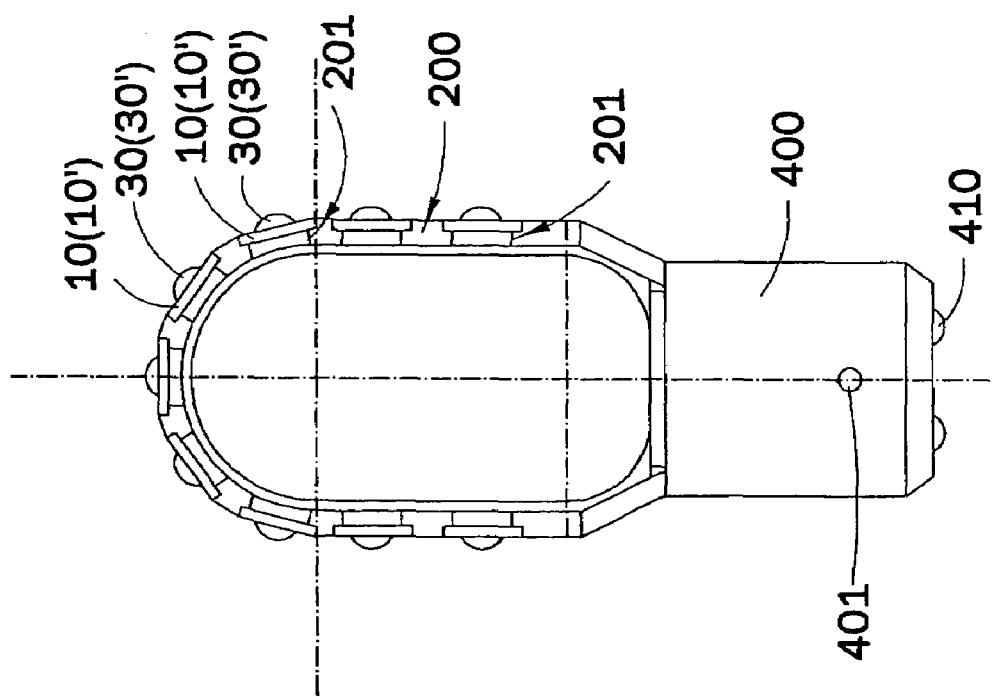
FIG. 8 is a partially sectional view of a high intensity light source arrangement according to a second preferred embodiment of the present invention.

Referring to FIG. 8, a second preferred embodiment of the present invention is illustrated, which is another alternative application of the first preferred embodiment, wherein a plurality of luminary units 10 (10') are supported around a heat dissipation unit 200 in an evenly distributing manner. According to the second embodiment, the heat dissipation unit 200 has a plurality of mounting through slots 201 spacedly formed around a curved outer surface of the heat dissipation unit 200, wherein the luminary units 10 (10') are fittedly mounted on the mounting through slots 201 of the heat dissipation unit 200 respectively. Each of the luminary units 10 (10') is arranged to be protected by the head shelter 30 (30') in such a manner that the head shelters 30' are outwardly protruded from the surface of the heat dissipation unit 200, as shown in FIG. 8. Similarly, a base housing 400 supports the heat dissipation unit 200, wherein electric input connecters 410 provided at a bottom end of the base housing 400 electrically connect to each of the luminary units 10 for electrically connecting to the power supply device. Moreover, a pair of mounting pins 401 for securely mounting the high intensity light source arrangement like a conventional light bulb to an electric socket shell.

Like what is shown in FIG. 7, the controlling device 60 can also be installed to the base housing 400 as shown in FIG. 8 for selectively controlling a flow of current passing to the luminary units 10 (10') of the second preferred embodiment. Similarly, the light control switch 61 of the controlling device 60 can be used to adjustably control the light intensity of the luminary units 10 (10') while the luminary elements 13 (13') of each of the luminary units 10 (10') are arranged in a parallel connection. The color control switch 62 of the controlling device 60 can be used to selectively produce a predetermined color of the luminary units 10 (10') while the luminary elements 13 (13') of each of the luminary units 10 (10') are arranged in a serial connection. So, the high intensity light source arrangement functions as a conventional light bulb and the high intensity light source arrangement can provide a higher light intensity and color selections while the conventional light bulb cannot.

Referring to FIG. 9, a third embodiment of the high intensity light source arrangement is illustrated, which is another alternative application of the above first preferred embodiment, wherein the base housing 40" is modified to further comprise a base 43" and a pair of supporting arms 42" upwardly extending from the base 43" for suspending the luminary unit 10" and the heat dissipation unit 20". In order words, the heat dissipation unit 20" is securely supported between two free ends of the supporting arms 42". The luminary unit 10" is arranged to face towards the base 43" in such a manner that the emitted light from the luminary unit 10" is distributing towards the base housing 40".

It is worth to mention that the high intensity light source arrangement of the third embodiment is capable of incorporating with a vehicle signal light having a concave reflective body, wherein the luminary unit 10" is positioned at a focus point of the concave reflective body in such a manner that the light from the luminary unit 10" can be directly projected on the concave reflective body for maximizing the reflecting light of the concave reflective body of the vehicle light.

FIGS. 10 and 11 illustrate a first and a second alternative modes of the third embodiment, wherein the luminary unit 10A, 10B is adapted for selectively adjusting the lighting position thereof.

As shown in FIG. 10, the luminary unit 10A is arranged to face against the base housing 40A in such a manner that the emitted light from the luminary unit 10A is distributing against the base housing 40A. As shown in FIG. 11, the luminary unit 10B is arranged to face aside in such a manner that the emitted light from the luminary unit 10B is distributing sidewardly with respect to the high intensity light source arrangement. In other words, the lighting position of the luminary unit 10A, 10B, 10C can be selectively adjusted according to the need of the user.

Figure 12:
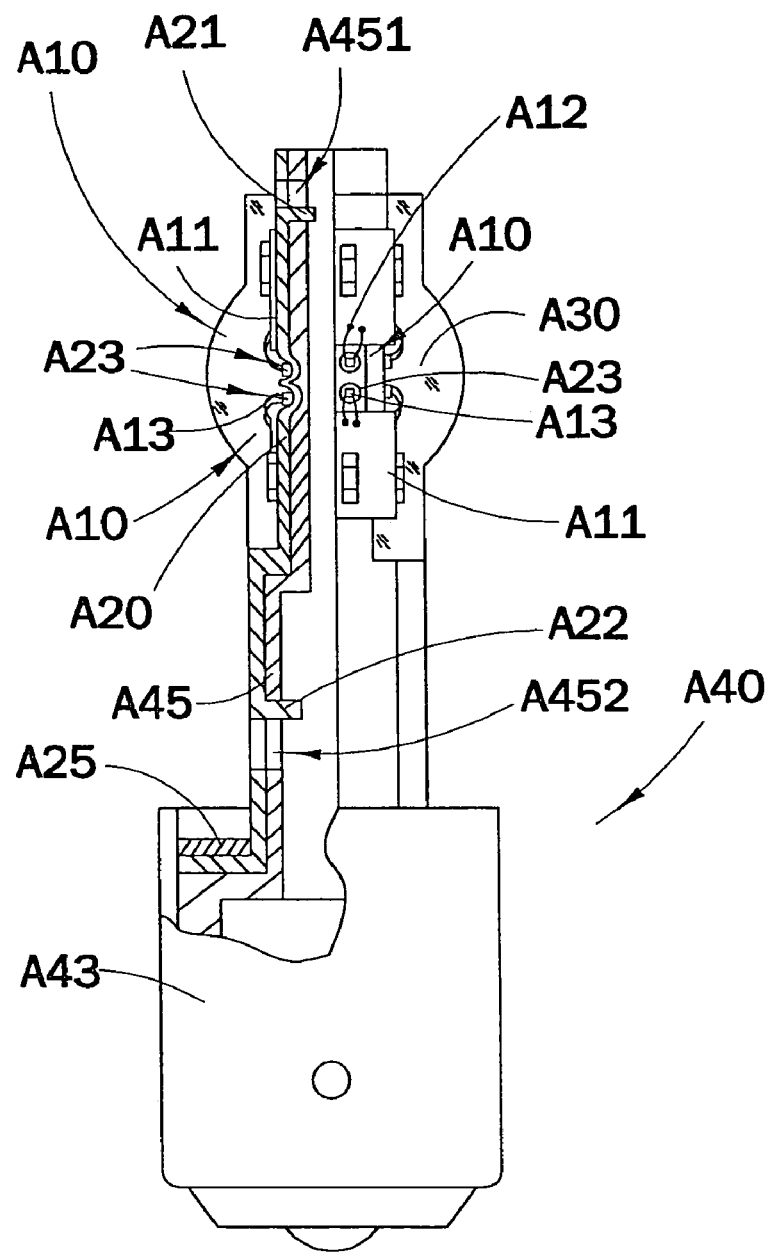
FIG. 12 is a partially sectional view of a high intensity light source arrangement according to a fourth preferred embodiment of the present invention.
Figure 13:
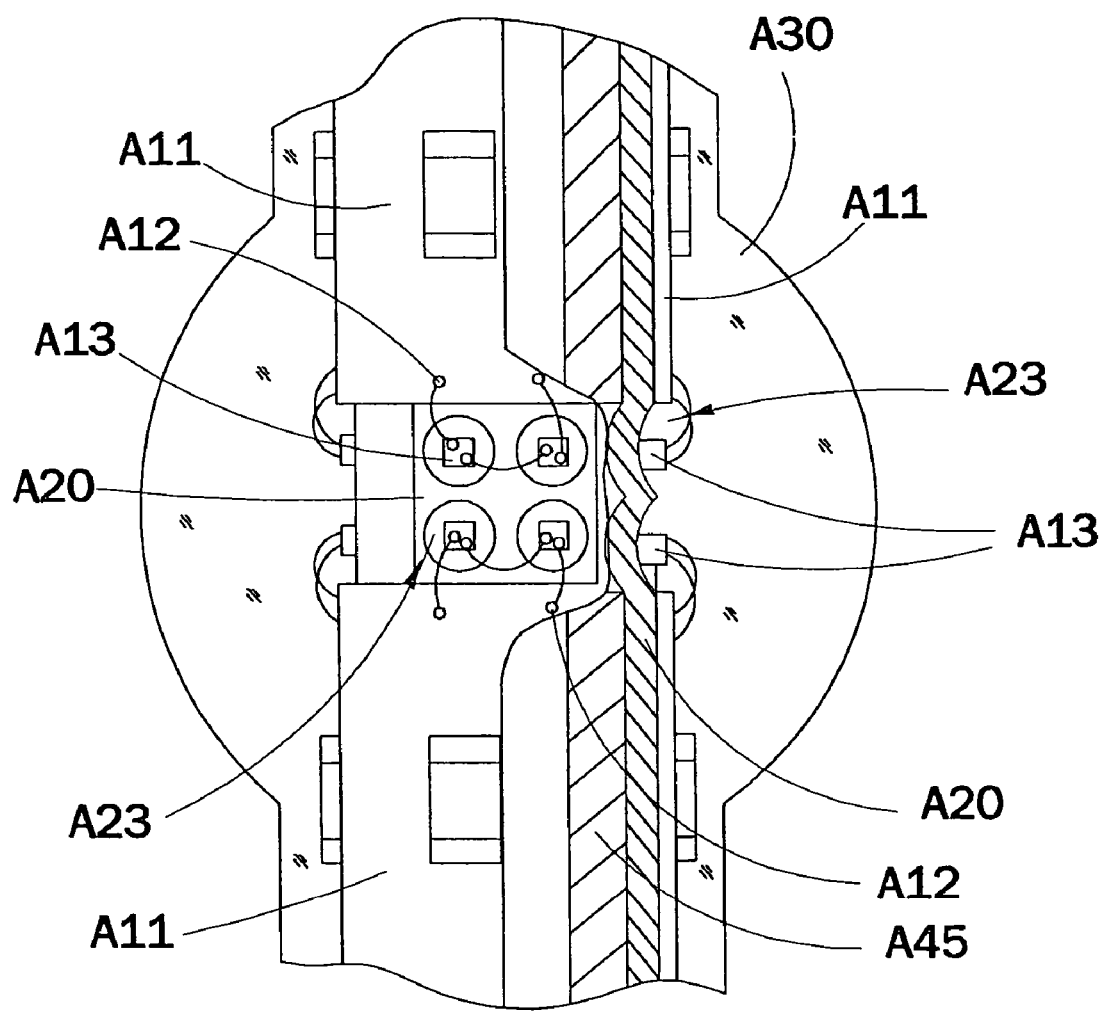
FIG. 13 is a partially sectional enlarged view of the high intensity light source arrangement according to the above fourth preferred embodiment of the present invention.
Figure 14:
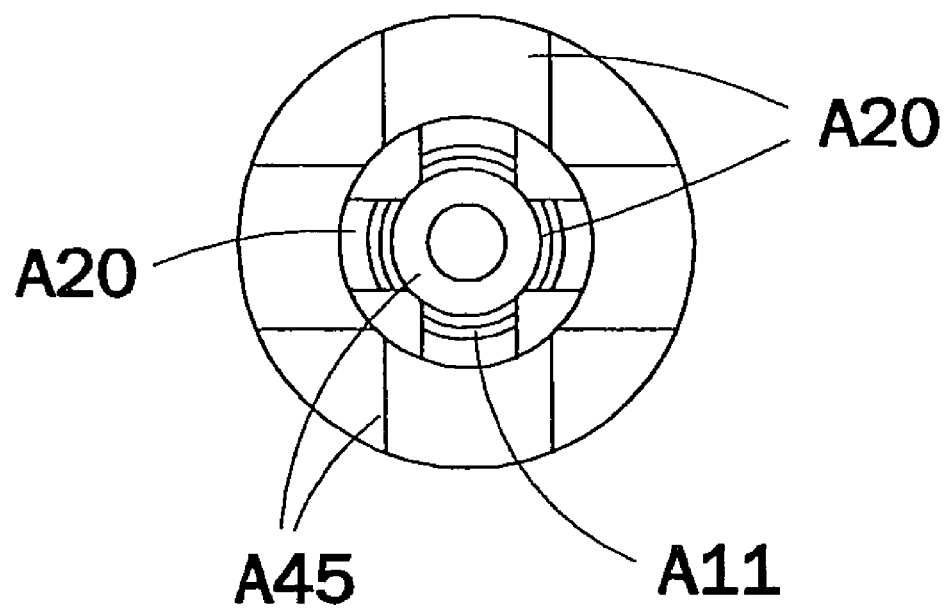
FIG. 14 is a top view illustrating the four supporting members mounted on the central shaft of the base housing of the high intensity light source arrangement according to the above fourth preferred embodiment of the present invention.

Referring to FIGS. 12 to 14, a fourth preferred embodiment of the high intensity light source arrangement is illustrated, wherein the luminary units A10 of the fourth embodiment are arranged to emit lights radially so as to enhance the light intensity of the present invention.

According to the fourth embodiment, the high intensity light source arrangement comprises a base housing A40, at least a heat dissipation unit A20 and at least a luminary unit A10. The base housing A40 further comprises a base A43 and an elongated central shaft A45 extended vertically from the base A43. There are four heat dissipation units A20 spacedly mounted on the central shaft A45 and extended along the central shaft A45, wherein the luminary units A10 are radially supported on the heat dissipation units A20 respectively.

The central shaft A45 is a hollow tubular body made of thermosetting plastic having high thermo-resistance ability that will not be deformed at 150.degree.C. or above. The central shaft A45, as shown in FIG. 13, has four upper elongated engaging slots A451 and four lower elongated engaging slots A452 radially formed thereon, so as to mount the four heat dissipation units A20 on the central shaft A45. Of course, alternatively, the central shaft A45 can be formed to have a square, triangular or even polygon cross section and the heat dissipation units A20 are simply mounted along the side surfaces of the central shaft A45 respectively.

The heat dissipation units A20 are each made of elongated metal strip having good heat conducting ability such as copper. Each of the heat dissipation units A20 comprises an upper engaging locker A201 and a lower engaging locker A22 inwardly protruded from the supporting member A46 and arranged to engage with the respective upper and lower engaging slots A451, A452 of the central shaft A45 by inserting therethrough so as to securely mount the heat dissipation unit A20 on the central shaft A45. Each of heat dissipation units A20 further has at least a circular groove indented thereon to function as a supporting platform A23. There are four circular groove type supporting platforms A23 indented, adjacent to each other, on each of the heat dissipation units A20.

Each of the luminary units A10 according to the fourth embodiment also comprises a luminary circuit A11 having at least a terminal A12 provided thereon, and a luminary element A13. The luminary elements A13 are respectively received in the circular groove type supporting platform A23 by attaching to the curved bottom surfaces of the supporting platform A23 respectively in such a manner that the luminary elements A13 are adapted for aligning on the heat dissipation units A20 to emit light radially with respect to the base housing A40.

As shown in FIG. 13, two of the luminary circuits A11 are attached on each of the heat dissipation unit A20 and positioned above and below of the supporting platforms A13 respectively, wherein the terminals A12 provided on the luminary circuits A11 are electrically electrified with the luminary elements A13 attached on the supporting platforms A23 respectively.

Figure 16B:
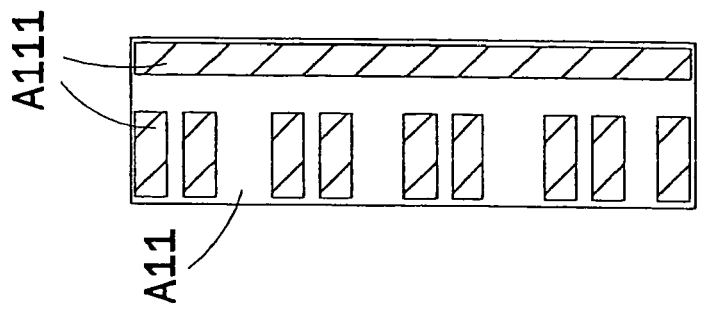
FIGS. 16A and 16B are circuit diagrams of a circuit film of the high intensity light source arrangement according to the above fourth preferred embodiment of the present invention.
Figure 16A:
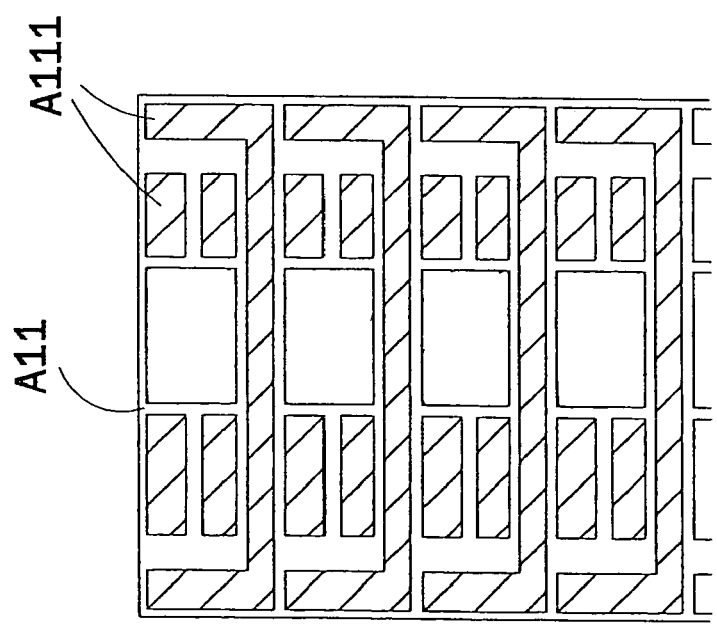

Each of the luminary circuits A11 is made of printed circuit film which is easier to adhere on the heat dissipation unit A20. Each of the luminary circuits A11 is arranged in a specific arrangement for controlling the luminary elements A13 in an electrified manner wherein at least an adhesive protecting layer A11 having high thermo-resistance ability is provided at a rear surface of the luminary circuit A11 to bond on heat dissipation unit A11, as shown in FIGS. 16A, and 16B, so as to protect the heat from the luminary element A13 damaging the luminary circuit A11.

Figure 15:
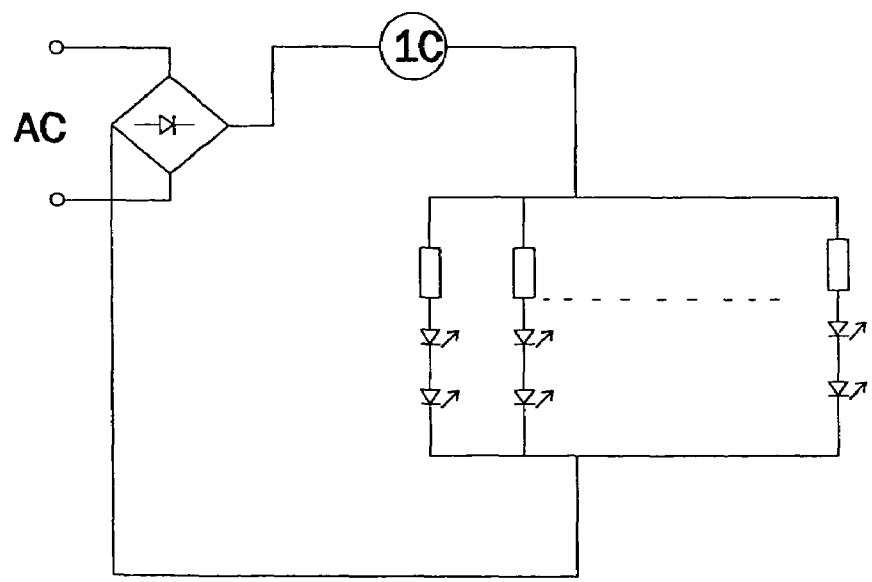
FIG. 15 is a circuit diagram of the high intensity light source arrangement according to the above fourth preferred embodiment of the present invention.

Each of the luminary elements A13 is a dual-terminal luminary element adapted for dual electrifying with the luminary circuit A11, as shown in FIG. 13, wherein the luminary circuit A11 is designed in a specific arrangement to control the electrification of the dual-terminal luminary element A13, as shown in FIG. 15.

An additional heat dissipation ring A25 is encirclingly mounted on lower potions of the four heat dissipation units A20. Accordingly, by means of the heat dissipation units A20 are directly contact with all the luminary elements A13 and the respective luminary circuits A11, a plurality of luminary elements A13 can be gathered together to increase the light intensity of light source arrangement without being burnt off by the heat because the heat generated from the luminary elements A13 are immediately transferred to the four heat dissipation units A20 respectively and then further dissipated to the heat dissipation ring A25.

The high intensity light source arrangement of the fourth embodiment also comprises a transparent head shelter A30 made of transparent material such as epoxy resin having high thermo-resistance ability. The transparent head shelter A30 has a spherical shape surrounding all the luminary circuits A11 and all the luminary elements A13 in an airtight manner, wherein the luminary elements 13 are positioned near to a center of the head shelter A30 such that the light can evenly distributed to an exterior of the head shelter A30. In other words, the supporting platforms A23 on the heat dissipation units A20 should be positioned close to the center of the head shelter A30. It is worth to mention that the shapes of the indented supporting platforms A23 and the head shelter A30 may affect the light reflection of the luminary elements A13 so as to affect the light intensity of the luminary unit A10.

Figure 19:
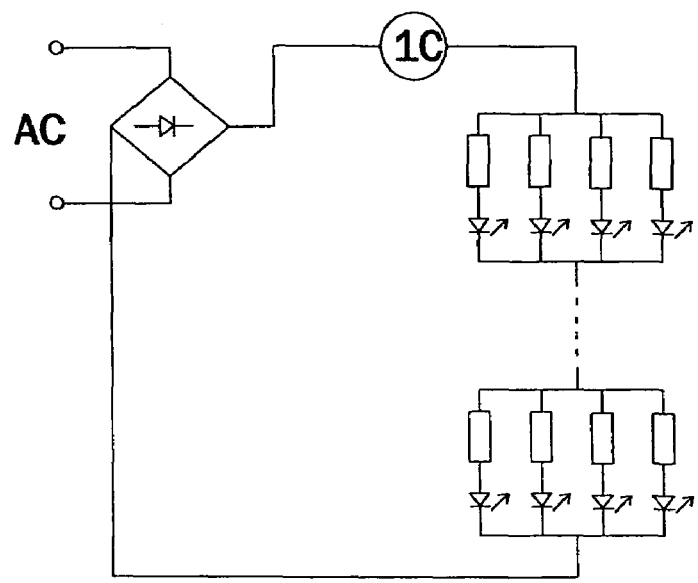
FIG. 19 is a circuit diagram of the alternative mode of the high intensity light source arrangement according to the above fourth preferred embodiment of the present invention.
Figure 17:
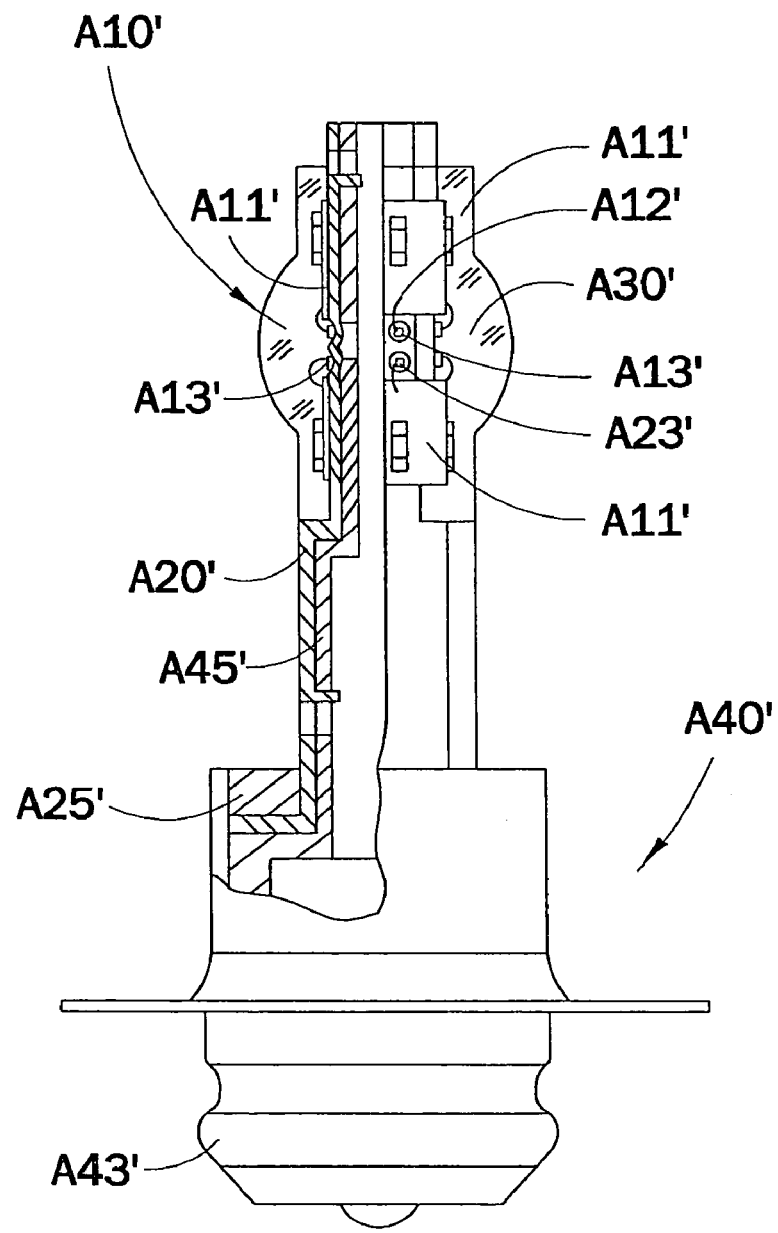
FIG. 17 is a partially sectional view of an alternative mode of the high intensity light source arrangement according to the above fourth preferred embodiment of the present invention.
Figure 18:
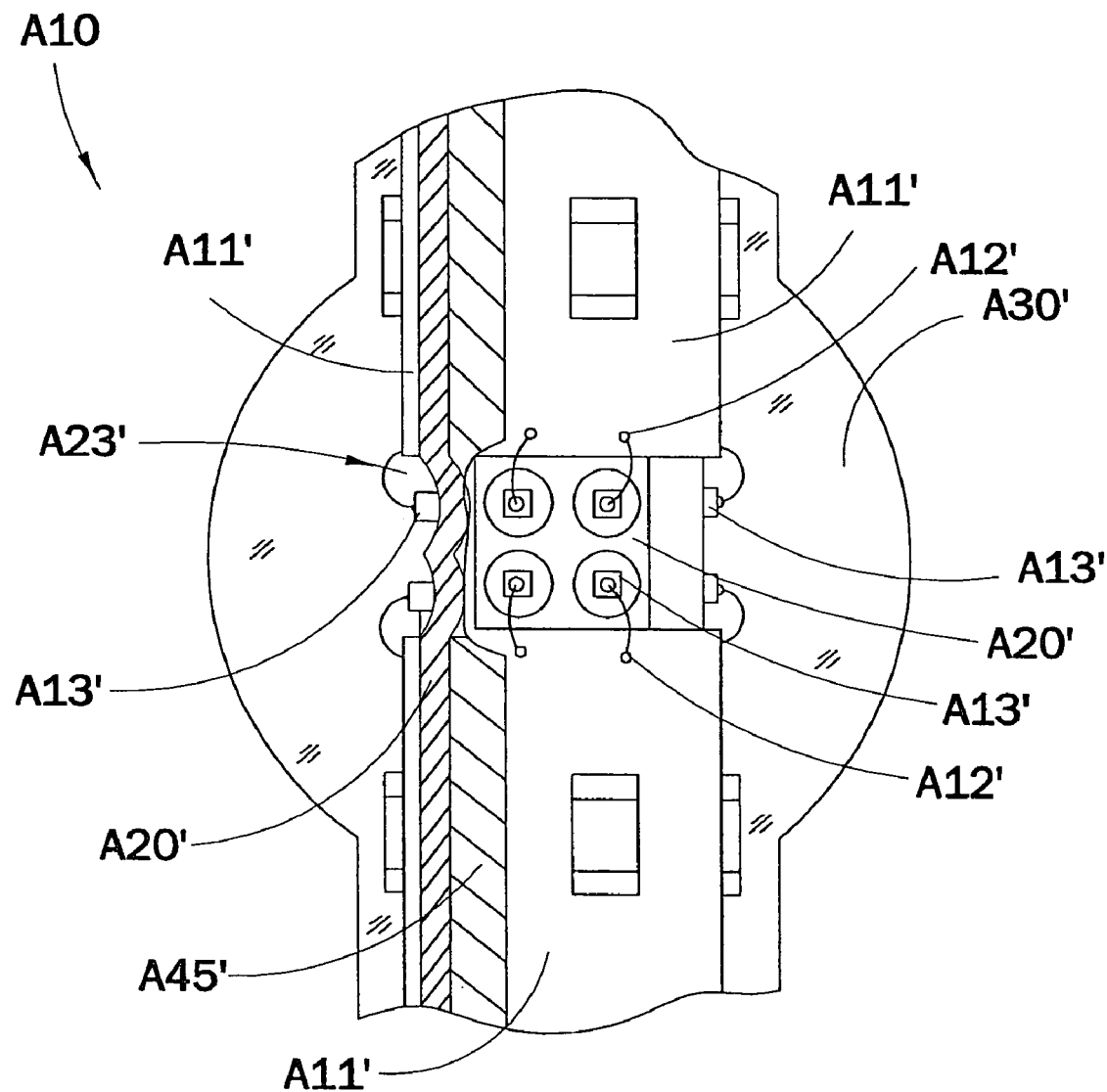
FIG. 18 is a partially sectional enlarged view of the alternative mode of the high intensity light source arrangement according to the above fourth preferred embodiment of the present invention.

FIGS. 17 to 19 illustrate an alternative mode of the above fourth embodiment having the same structural design except the luminary element A13' is a single terminal luminary element instead of the dual terminal luminary element A113.

As shown in FIG. 18, each of the luminary elements A13' is arranged to be a negative pole and the heat dissipation units A20' are electrically connected with the terminals A12' on the respective luminary circuits A13' in such a manner that the heat dissipation units A20' can provide both conduction and heat dissipating purposes. Thus, each of the luminary circuits A11' is designed in a specific arrangement to control the electrification of the single-terminal luminary element A13', as shown in FIG. 19.

Figure 20:
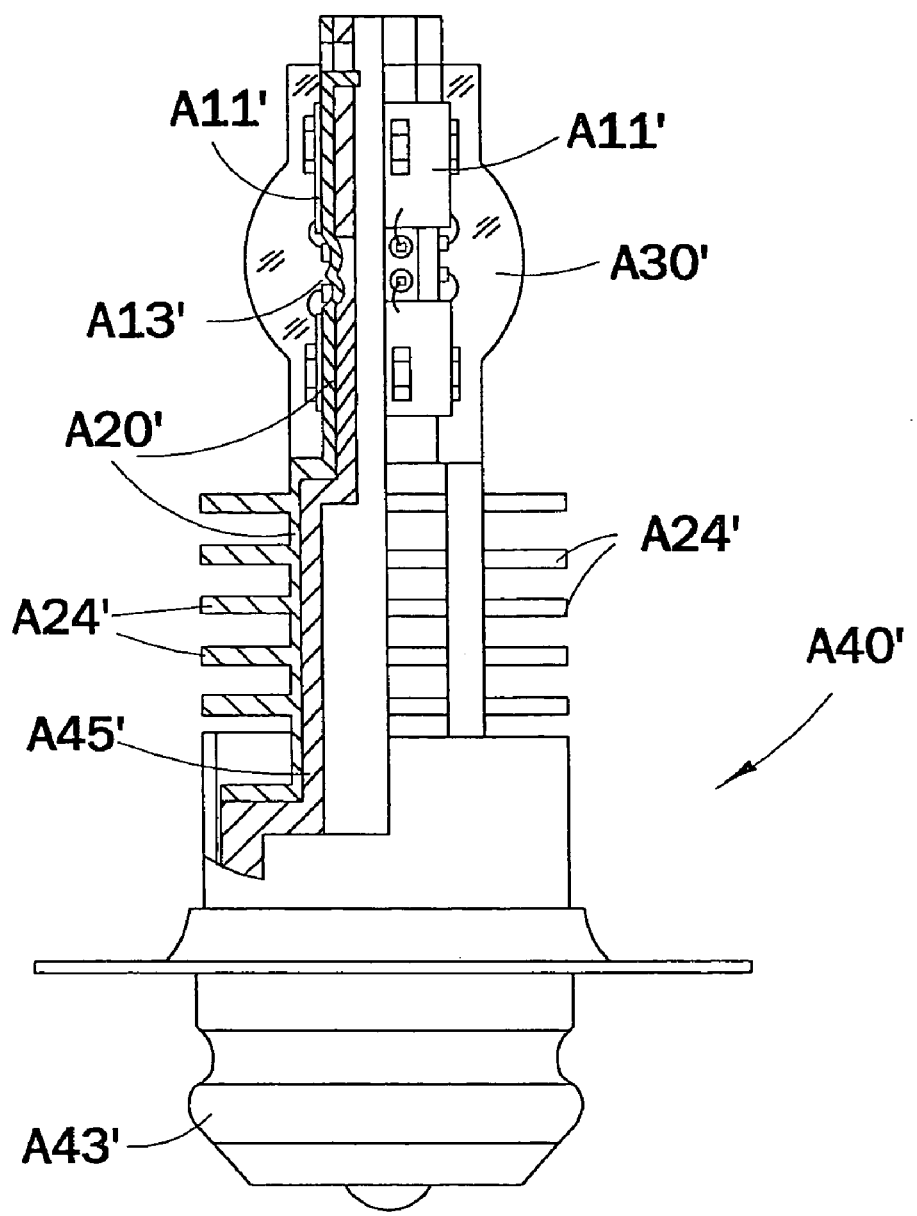
FIG. 20 illustrates an alternative mode of a heat dissipation unit of the high intensity light source arrangement according to the above fourth preferred embodiment of the present invention.

FIG. 20 illustrates an alternative mode of the heat dissipation unit A20", wherein a plurality of heat dissipating fins A24" are spacedly and radially protruded from the lower portion of the heat dissipation unit A20" for increasing the heat dissipating area of the heat dissipation unit A20" so as to enhance the heat dissipating purpose thereof. Preferably, the heat dissipating fins A24' are integrally extended from the heat dissipation unit A20" since the heat dissipation unit A20" itself is a good heat conductor so as to form a one-piece member for easy manufacture.

It is worth to mention that the high intensity light source arrangement of the fourth embodiment is capable of incorporating with a flashlight having a concave reflective body. Since the luminary unit A10 emits the light for 360.degree., the light can be projected on the concave reflective body for maximizing the reflecting light of the concave reflective body of the flashlight. Moreover, the multiple numbers of the luminary units A10 highly increase the light intensity of the flashlight, which is plural of the conventional light bulb type flashlight. Thus, the high intensity light source arrangement of the present invention is more durable than the conventional one that even though the flashlight is dropped on the floor, the luminary unit is still well protected without damage.

Figure 21:
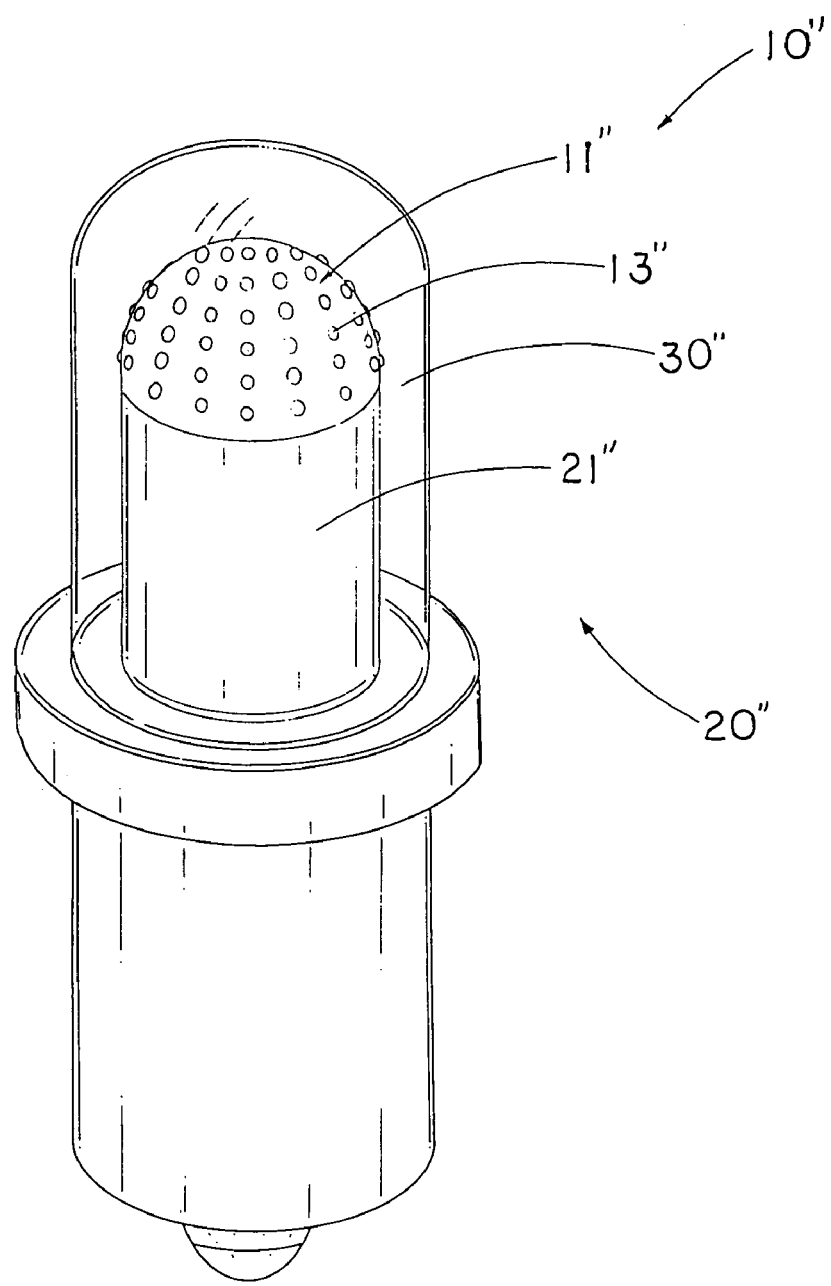
FIG. 21 is a perspective view of the high intensity light source arrangement according to a fifth preferred embodiment of the present invention illustrating the luminary circuit is substantially defined into a spherically curved shape, so that a plurality of luminary elements are disposed onto such spherical body to enhance the light emitting effect.

Referring to the FIG. 21, a high intensity light source arrangement according to a fifth preferred embodiment of the present invention is illustrated. Like the embodiments mentioned above, the luminary unit 10" comprises a luminary circuit 11" which can be a circuit board or a printed circuit film, at least a terminal 12" electrically connected to the luminary circuit 11", and a plurality of luminary element 13" adapted for electrifying with the terminal 12" to emit light.

Here, the heat dissipation unit 20" supports underneath the luminary unit 10" for directly dissipating heat generated from the luminary unit 10". A transparent head shelter 30" is mounted on the luminary unit 10" in an airtight manner.

According to the fifth preferred embodiment of the present invention, the luminary circuit 11" of the luminary unit 10" is made in curved shape. The heat dissipation unit 20" comprises a ring shaped body 21", and a dome 22" integrally formed at a top end of the ring shaped body 21" for correspondingly supporting the curve shaped luminary circuit 11" thereon.

As shown in FIG. 21, the luminary unit 10" is securely perched onto the dome 22" of the heat dissipation unit 20" by overlappedly printing the luminary circuit 11" onto the dome 22", wherein the bottom surface and the inner circumferential side of the luminary unit 10" are well contact with the top surface and the outer circumferential side of the dome 22" of the heat dissipation unit 20", so that the heat generated from the luminary unit 10" is capable of being directly dissipated by the heat dissipation unit 20" to outside so as to increase the cooling effect of the luminary unit 10". In other words, the contact area between the luminary circuit 11" and the heat dissipation unit 20" is substantially enlarged by expanding the conventional flat interface between the luminary circuit 11" and the heat dissipation unit 20" into a dome shaped semi-spherical contacting interface for enhancing the cooling effect of the heat dissipation unit 20" so as to ultimately dissipate the heat generated by the luminary unit 10". Moreover, the dome shaped interface enables more luminary elements 13" supported by the heat dissipation unit 20". That is to say, the substantially explored dome body of such heat dissipation unit 20" not only provides a solid connection between the luminary unit 10" and the heat dissipation unit 20" but also significantly increases the heat dissipating area with the outside environment to further cool down the temperature of the luminary unit 10".

According to the fifth preferred embodiment, the luminary circuit 11" of the luminary unit 10" is made in semi-spherical shape. On the other hand, the luminary circuit 11" has a plurality of luminary terminals 12" provided thereon, so that each of the plurality of luminary elements 13 is electrified with respective terminal 12".

Figure 23:
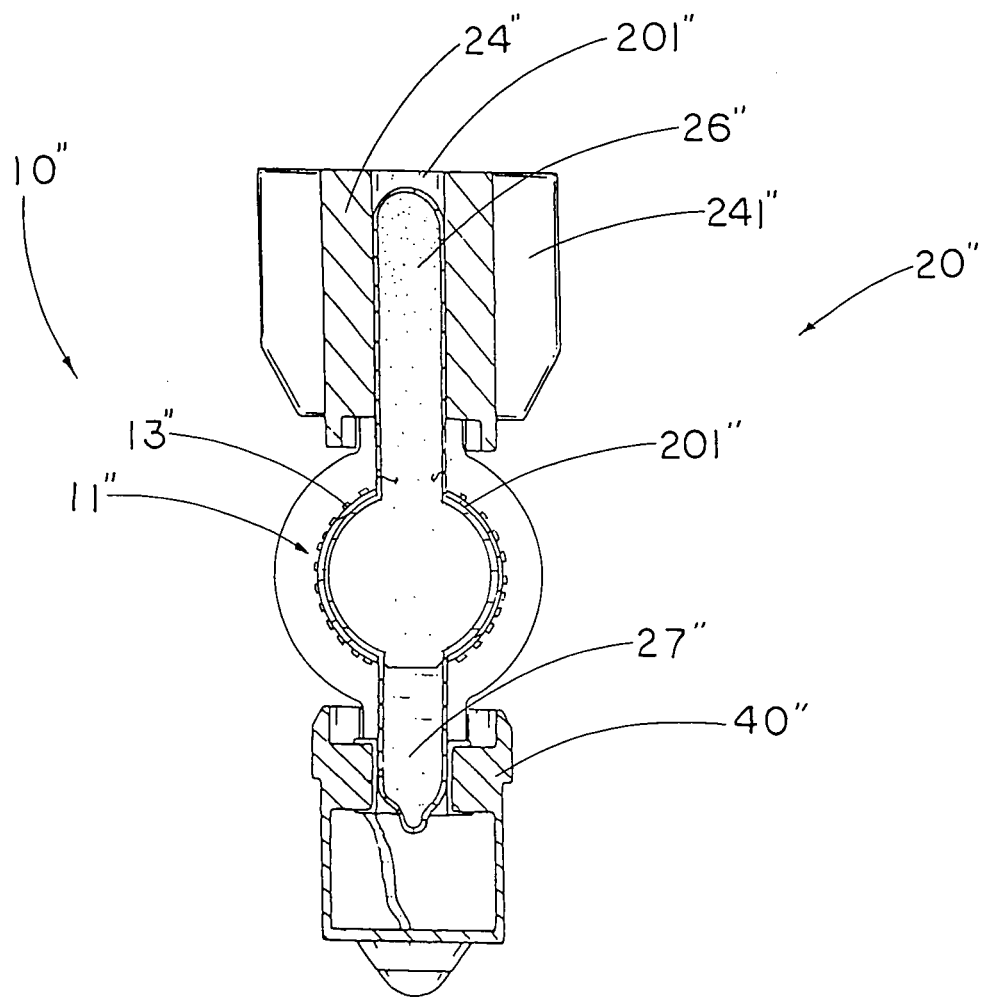
FIG. 23 is a sectional view of the high intensity light source arrangement according to the above fifth preferred embodiment of the present invention, showing the heat sink comprises a sealed chamber for facilitating the heat dissipation process.

Moreover, the heat dissipation unit 20" further comprises a heat sink 24", a sealed chamber 26" for containing a predetermined volume of cooling agent 27" therein as shown in FIG. 23. The sealed chamber 26" has a first portion positioned in the interior space of the base housing 40" and a second portion extended to the heat sink 24". Accordingly, the cooling agent 27" is capable of being vaporized by the heat generated from the luminary unit 10" and condensed by the heat sink 24" so as to substantially transfer the heat from the luminary unit 10" towards the heat sink.

Figure 22:
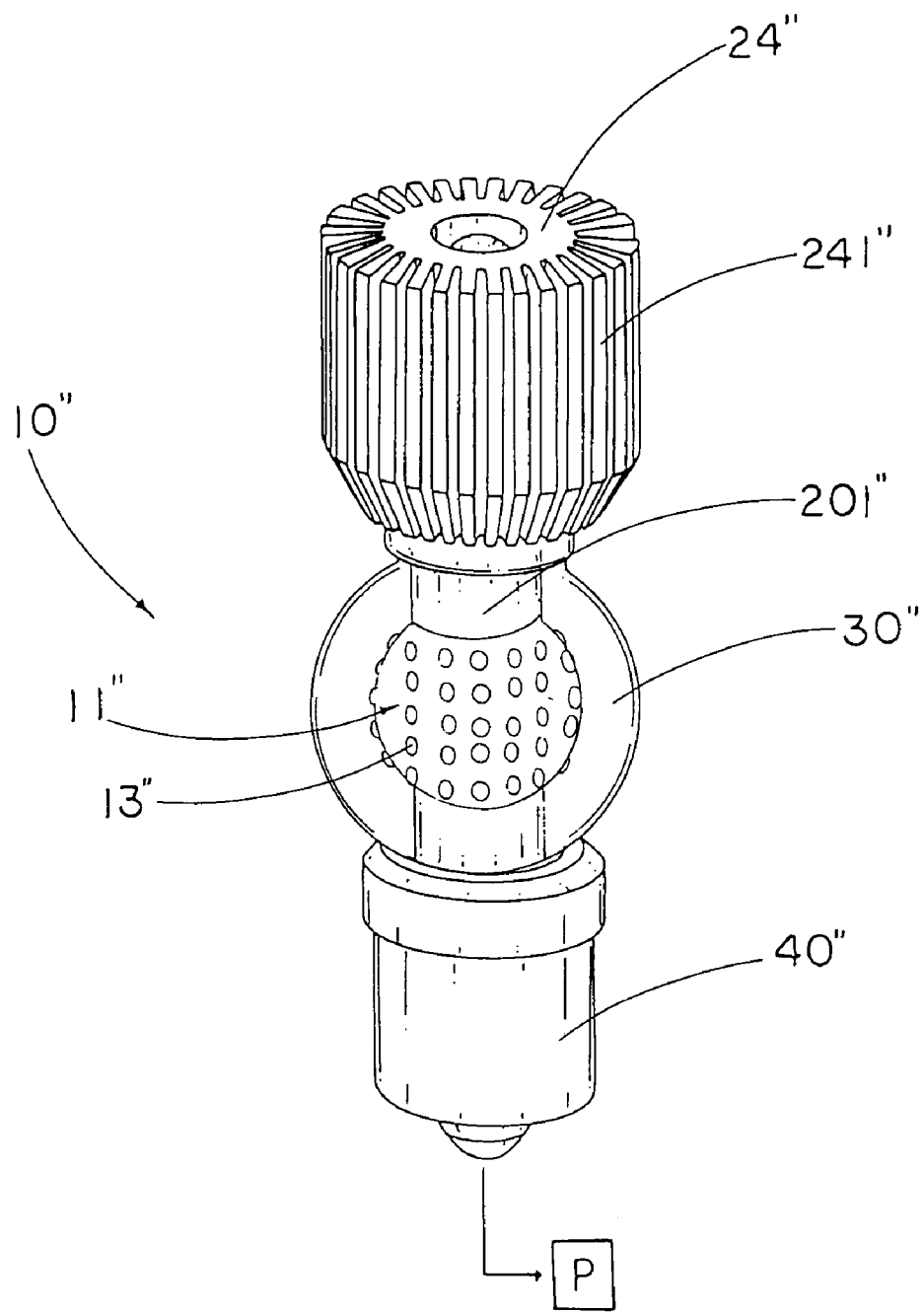
FIG. 22 is a perspective view of the high intensity light source arrangement according to a fifth preferred embodiment of the present invention showing the heat dissipation unit comprise a heat sink for substantially dissipating the heat generated from the light source.

Here, the dissipation unit 20" has a supporting frame 201" which is constructed as an elongated hollow member to define the interior space wherein the supporting frame 201" is made of material having high thermal conductivity such as copper or aluminum. Accordingly, the supporting frame 201" could be formed to have a circular cross section, triangular cross section, rectangular cross section, or polygonal cross section, wherein the heat sink 24" is snugly inserted into the supporting frame in such a manner that the heat sink 24" must be in contact with a peripheral wall of the supporting frame 201". Moreover, a middle portion of the supporting frame 201" is gradually bulged from the elongated hollow supporting frame 201" to define an enlarged supporting interface to attach the luminary unit 10" thereon as shown in FIG. 22. In other words, the luminary unit 10" could be defined to have a curved shape to be overlappedly printed onto the bulge portion of the supporting frame 201". The heat dissipation unit 20" comprises a spherical shaped body integrally formed at a middle portion of the supporting frame 201" to be encased by the luminary circuit 11" of the luminary unit 10" to strengthen the emitting effects.

Accordingly, the luminary element 13" is mounted on the peripheral surface of the supporting frame 201" to electrically connect with the luminary circuit 11". As mentioned before, the luminary element 13" is a double bonded diode has two terminal electrodes electrically connected to the luminary circuit 11" in such a manner that the light is emitted by the luminary element 13" when the two terminal electrodes are electrified. Practically, different kinds of luminary elements 13" could provide different colors of light such as red, blue or green. It is noted that luminary element 13" could be the single bonded diode having a terminal electrode electrically connected to the supporting frame 201" while another terminal electrode electrically connected to the luminary circuit 13".

Preferably, the luminary circuit 11" comprises an elastic board layer firmly attached to the peripheral surface of the supporting frame 201", e.g. by glue, and the luminary circuit 11" is formed on the board layer to electrically connect to the luminary element 13". Or otherwise, the luminary circuit 11" could be directly imprinted on the peripheral surface of the supporting frame 201" so that the luminary element 13" could be mounted onto the peripheral surface of the supporting frame 201 so as to electrically connect with the luminary circuit 11".

For protecting the luminary element 13", the high intensity light source arrangement of the present invention further comprises a transparent light shelter 30" sealedly protect the luminary unit 10". The light shelter 30" is preferably made of resin or other similar material having high thermo-resistance ability that is molded to integrally enclose the peripheral surface of the supporting frame 201".

Furthermore, The light shelter 30" has a light projecting portion provide on the supporting frame at a position aligning with the luminary element 13" to function as a lens in such a manner that the light produced by the luminary element 13" is arranged to pass through the light projecting portion of the light shelter 30" having a spherical shaped to be amplified so as to enhance the light intensity of the luminary unit 10". Preferably, the luminary elements 13" are positioned close to a focus point of the light projecting portion of the light shelter 202" to evenly distribute the light therethrough.

It is worth to mention the heat sink 24" is made of material having high thermal conductivity. As shown in FIG. 22, the heat sink 24" has a plurality of heat dissipating blades 241" arranged to cool down the cooling agent 27", which is evaporated in vapor form by the heat generated by the luminary unit 10" so as to condense the cooling agent 27" within the sealed chamber 26" from its vapor form to its liquid form.

Here, the cooling agent 27" should be a liquid having lower vaporization temperature, e.g. 60°-70° C., wherein the cooling agent 27" is concealed within the sealed chamber 26". When the luminary unit 10" is utilized over a period of time, the luminary element 13" would produce heat and the temperature within the sealed chamber is increased. Whenever the temperature of the cooling agent 27" is higher than the vaporization temperature of the cooling agent 27", the cooling agent starts to be vaporized at another end of the sealed chamber 26". According to the heat transfer, heat flows from a higher temperature region to a lower temperature region. Therefore, the cooling agent 27" in vapor form flows to the original portion of the sealed chamber 26" to cool down the temperature of the heat sink 24" as well as the luminary unit 10". Accordingly, the heat from the luminary unit 10" is more efficiently transferred to the heat sink 24" through the phase equilibrium process of the cooling agent 27". In addition, the cooling agent 27" will vanish during the vaporization process thereof because the cooling agent 27" is sealedly contained within the sealed chamber 24" so as to prolong the service life span thereof.

It is noted that the cooling agent 27" has a higher heat sensitivity than metal so that it can quickly and effectively transfer the heat from the luminary unit 10" to dissipate from the heat sink 24" such that the surface of the light shelter 202" could be maintained at a temperature that an operator is able to touch without burning his or her hand even though the light head has been serviced for a long time of period.

In brief, the cooling cycle of the cooling agent 27" is that the cooling agent 27" will be vaporized by the heat of the luminary unit 10" and cooled down by the heat sink 24" to condense the cooling agent 27" back to its liquid form. The cooling agent 27" is guided to flow back towards the luminary unit 10" light head along a conduction channels to enhance the cooling cycle. In other words, when the vaporized cooling agent is cooled down to liquid form through the heat sink 24", the conduction channels are arranged to guide the cooling agent 27" back to its original position. In addition, the conduction channels also substantially increase the contacting area between the heat conductor and the cooling agent so as to enhance the cooling effect of the light source of the present invention.

Figure 24:
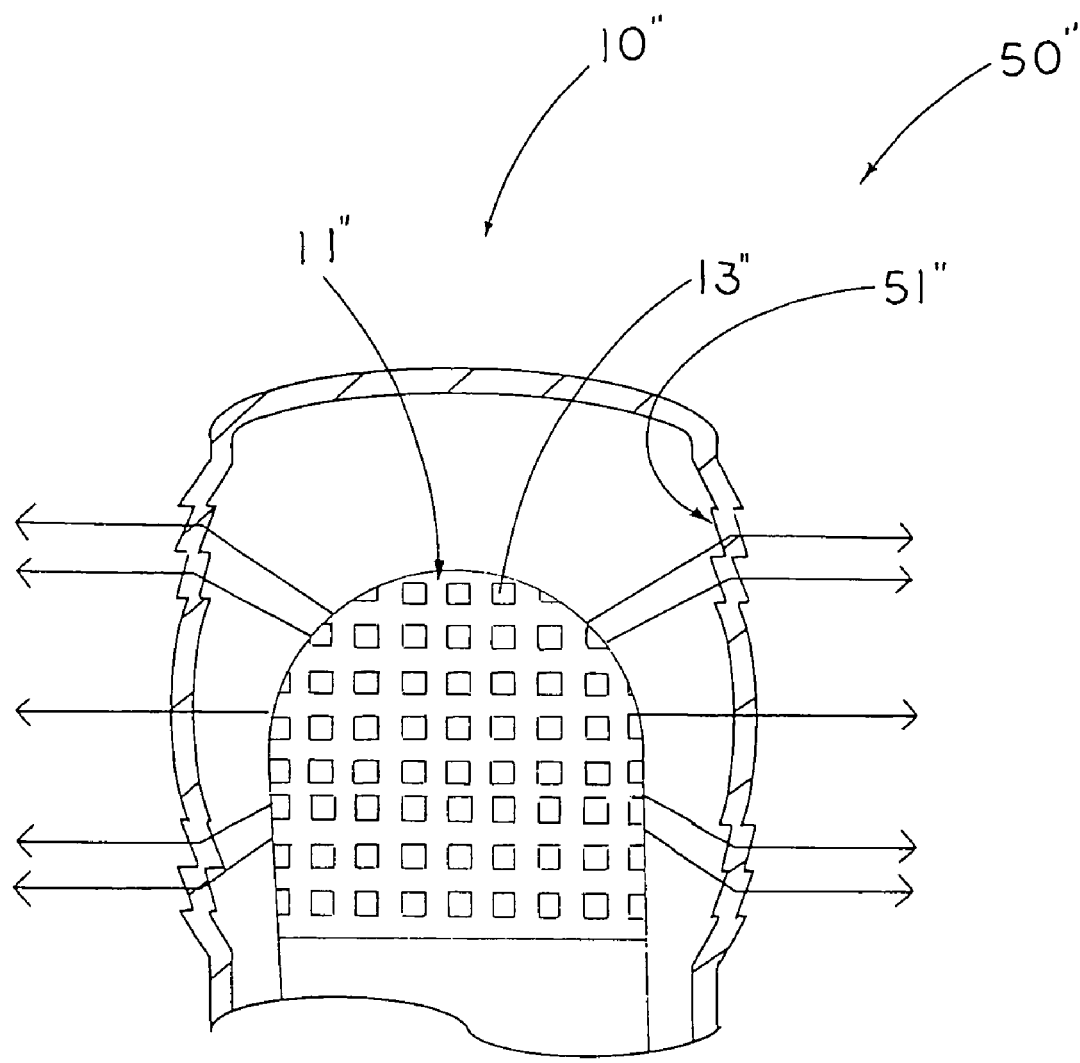
FIG. 24 is a sectional schematic view illustrating the high intensity light is sheltered by a converging light casing for allowing diverged light beam projected out in 360° direction.

As shown in FIG. 24, the high intensity power source according to the present invention further comprises a converging element 50" comprises a plurality of lens ring 51" integrally formed on a peripheral wall of a light housing 52" wherein each of the lens rings 51" is inclinedly extended at a diffraction angle for diverging the light beams from the luminary elements 13" to form collimated light beams.

As mentioned before, the high intensity light source arrangement comprises a luminary unit 10" which is overlappedly wrapped onto a spherical support frame of the dissipation unit 20" to form a 360° LED emitter coaxially supported within the light housing 52" for generating the light beams in 360° radial direction, wherein the light beams are adapted to be diffracted by the lens rings 51" to form the collimate light beams so as to horizontally project out from a light window of the light housing 52" in 360° direction.

Accordingly, the luminary unit 10" is defined as a 360° LED emitter mounted to a spherical supporter wherein the luminary circuit 11" is printed thereon and a plurality of luminary elements 13", i.e. diodes, are supported on the supporter to electrically connect to the luminary circuit 11" for generating the light beams in 360° radial direction. Here, the luminary elements 13" are coaxially positioned with respect to the lens rings 51" wherein when the radial light beams are projected towards the lens rings 51", each of the lens rings 51" is inclined at the predetermined diffraction angle to self-adjust the radial light beam to become the collimated light beam. On the other hand, the supporter is embodied as a heat sink to dissipate the heat generated from the diodes as well.

Figure 25:
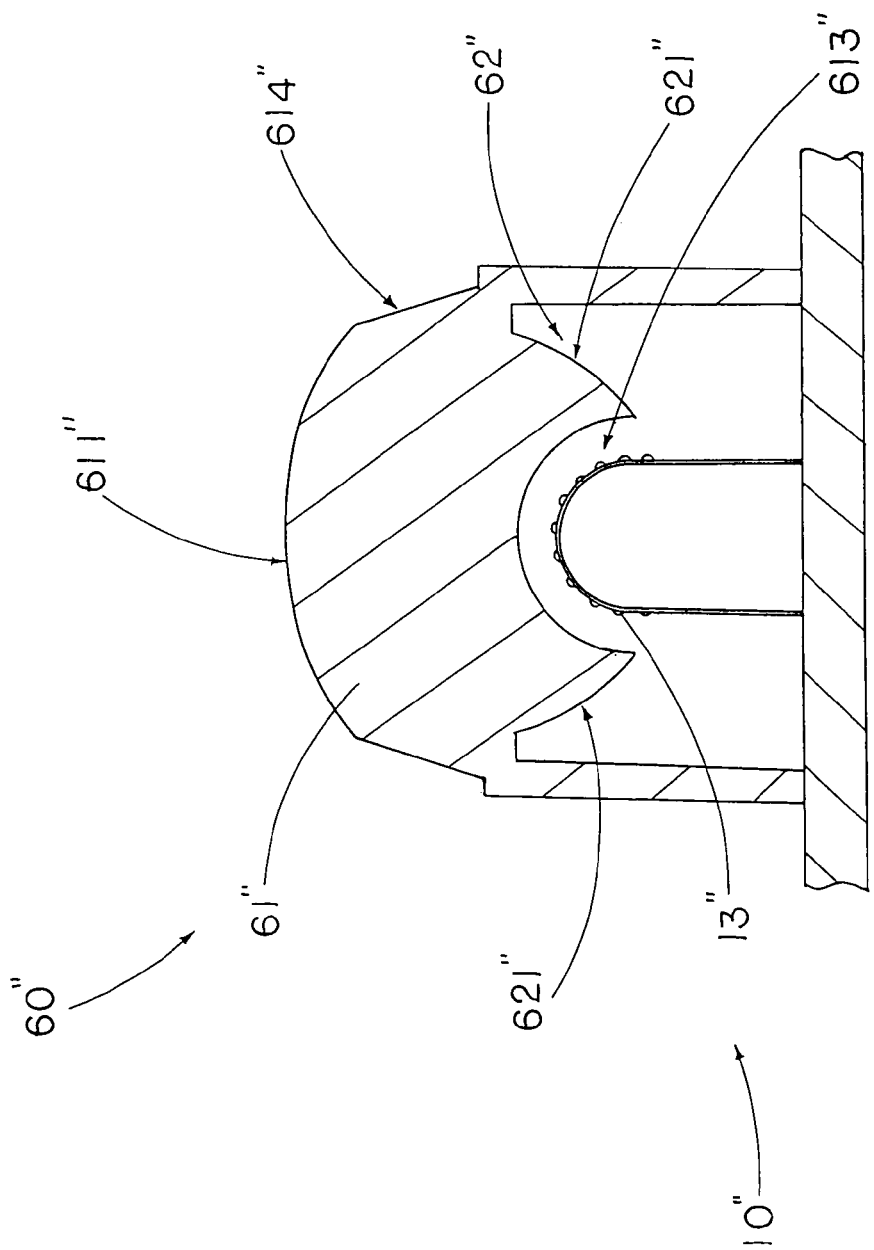
FIG. 25 is a sectional side view of the above fifth preferred embodiment of the present invention, illustrating the high intensity light is covered by a lens body to be reflected at a diffraction portion.
Figure 26:
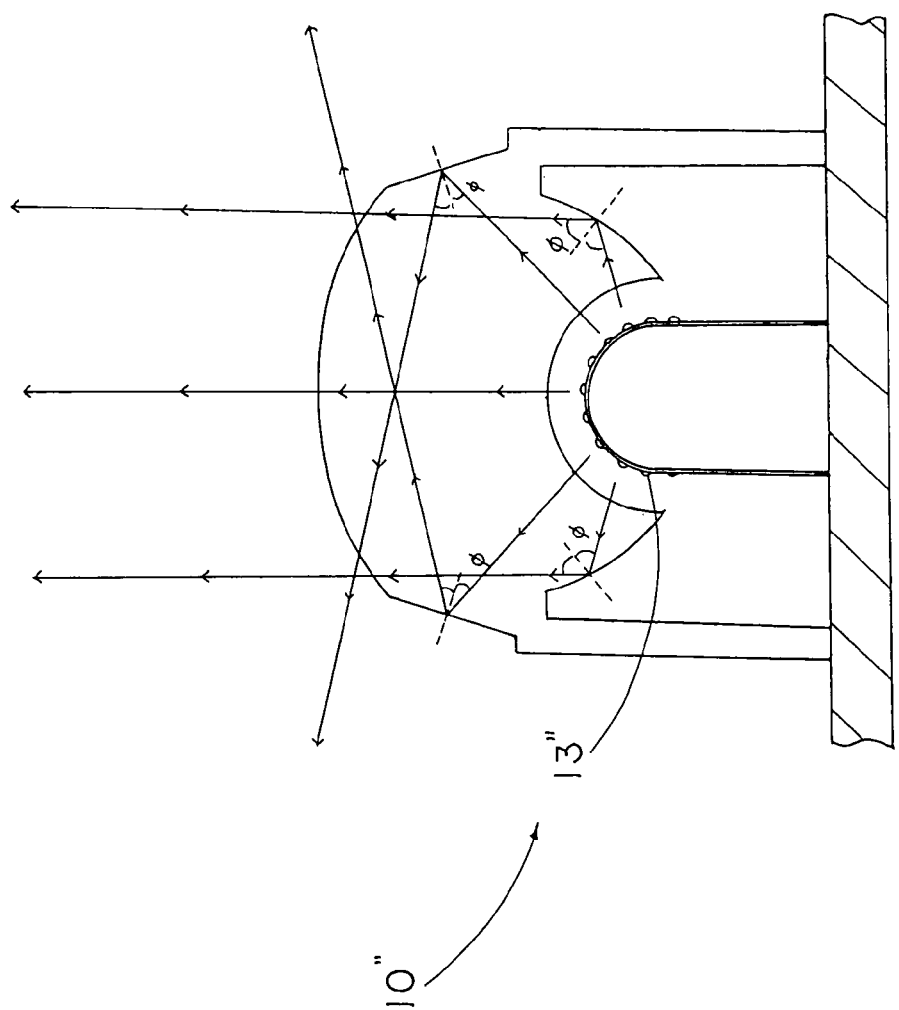
FIG. 26 is schematic view showing the light emitted from the luminary unit is converged by a lens body according to the fifth preferred embodiment of the present invention.

Referring to FIG. 25 and FIG. 26, another mode of the high intensity light source arrangement according to the above fifth embodiment is illustrated. Here, the light source arrangement further comprises at least a lens body 60" for covering the luminary unit 10".

The lens body 60" has an illumination portion 61" defining a light projecting surface 611" and a light receiving surface 612", and at least a diffraction portion 62" defining a light diffraction surface 621" inclinedly extended at a diffraction angle ($<$ from the light receiving surface 612" of the illumination portion 61, wherein a diffraction density of the illumination portion 61" is different from that of the diffraction portion 62".

The lens body 61" covers the luminary unit 10" that radially and spherically emitting light towards the light receiving surface 612". A first portion of the light emitted from the luminary unit 10" penetrates through the illumination portion 61" to the light projection surface 611 thereof while a second portion of the light penetrates through the illumination portion 61" to the diffraction portion 62", wherein when the light reaches the light diffraction surface 621" of the diffraction portion 62" at an angle larger than that diffraction angle $\Phi$, the light would be substantially reflected at the light diffraction surface 621" back towards the light projecting surface 611", such that the light from the luminary unit 10" is converged to project at the light projecting surface 611" of the lens body 60".

Accordingly, the diffraction density of the illumination 61" is larger than that of the diffraction portion 62" such that when an illumination angle of the light projects towards the light diffraction surface 621" is larger than the diffraction angle $\Phi$ of the diffraction portion 62", the light is reflected at the light diffraction surface 621" towards the light projecting surface 611".

Here, the lens body 60" has a receiving cavity 613" indently formed at the illumination portion 61" to define the light receiving surface 612" as a surrounding wall of the receiving cavity 613", wherein the luminary unit 10" is disposed in the receiving cavity 613" for generating radially propagating light towards the lens body 60" through the light receiving surface 612".

Accordingly, the receiving cavity 613" preferably has a semi-spherical shape wherein the luminary unit 10" is disposed at the focus point of the receiving cavity 613". Moreover, the light diffraction surface 621" is extended from the surrounding wall of the receiving cavity 613" in an edge to edge manner such that the light generated from the luminary unit 10" is adapted to penetrate through the surrounding wall (i.e. the light receiving surface 612") of the receiving cavity 613" towards the light diffraction surface 621".

What is more, the diffraction portion 62" is peripherally and formed at a side portion of the lens body 60" to encirclingly surround the luminary unit 10". In other words, the diffraction portion 62" of the lens body 60" is peripherally formed at a position adjacent to the illumination portion 61" to surround the luminary unit 10" so as to communicate the light receiving surface 611 with the light diffraction surface 621. Thus, the luminary 10" is adapted to illuminate light radially to partially project to the light diffraction surface 621". In other words, the diffraction portion 62" is formed adjacent to the receiving cavity 613" to optically communicate the receiving cavity 613" with the diffraction portion 62".

The light projecting surface 611" is formed as a top curved surface of the lens body 60" having a predetermined radius curvature which defines a predetermined angle of the illumination by which the light penetrating through the illumination portion 61" is substantially limited for emitting out of the lens body 60". For example, the radius of the curvature may be embodied as defining an illumination angle of around 70° with respect to the luminary unit 10".

The illumination portion 61" and the diffraction portion 62" have different diffraction densities respectively in such a manner that the light passing from the illumination portion 61" is arranged to be diffracted by the light diffraction surface 621" in accordance with the well-established Snell' Law of diffraction. In particular, the incidence angle of the light beams impinging on the light diffraction surface 621" is greater than a threshold angle of total internal reflection in accordance with a ratio of diffraction density of the illumination portion 61" and the diffraction portion 62", such that light impinging on the light diffraction surface 621" will be reflected back to the illumination portion 61" by total internal reflection. As a result, the reflected light beams are capable of emitting out of the illumination portion 61" through the light projecting surface 611.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure form such principles. Therefore, this invention includes all modifications encompassed within the spirit and scope of the following claims.

What is claimed is:

1. A high intensity light source arrangement, comprising:
   a luminary unit comprising a luminary circuit, at least a terminal electrically connected to said luminary circuit, and at least a luminary element electrifying with said terminal for emitting light, wherein said luminary circuit is printed onto a spherical body for supporting said luminary element emitting in a multi-directional way;
   a heat dissipation unit which dissipates heat generated from said luminary unit;
   a base housing which comprises an electric input connector electrically connected to said luminary unit; and
   a converging element comprises a light housing for enclosing said luminary unit and a plurality of lens rings integrally formed on a peripheral wall of said light housing, wherein each of said lens rings is inclinedly extended at a diffraction angle for diverging a light beam from said luminary element to form a collimated light beam.

2. The high intensity light source arrangement, as recited in claim 1, wherein said heat dissipation unit comprises a heat sink and a sealed chamber containing a predetermined volume of cooling agent which is capable of being vaporized by said heat generated from said luminary unit and being condensed by said heat sink so as to substantially transfer said heat from said luminary unit towards said heat sink.

3. The high intensity light source arrangement, as recited in claim 2, further comprising a lens body for covering said luminary unit to converge a light emitted from said luminary unit, said lens body has an illumination portion defining a light projecting surface and at least a diffraction portion defining a light diffraction surface inclinedly extended at a diffraction angle, wherein a diffraction density of said illumination portion is different from that of said diffraction portion, wherein a first portion of said light emitted from said luminary unit penetrates through said illumination portion to said light projecting surface thereof while a second portion of said light reach said light diffraction surface of said diffraction portion at an angle larger than said diffraction angle, said light is substantially reflected at said light diffraction surface back towards said light projecting surface, thus converging said light projected onto said light projecting surface.

4. The high intensity light source arrangement, as recited in claim 1, further comprising a lens body for covering said luminary unit to converge a light emitted from said luminary unit, said lens body has an illumination portion defining a light projecting surface and at least a diffraction portion defining a light diffraction surface inclinedly extended at a diffraction angle, wherein a diffraction density of said illumination portion is different from that of said diffraction portion, wherein a first portion of said light emitted from said luminary unit penetrates through said illumination portion to said light projecting surface thereof while a second portion of said light reach said light diffraction surface of said diffraction portion at an angle larger than said diffraction angle, said light is substantially reflected at said light diffraction surface back towards said light projecting surface, thus converging said light projected onto said light projecting surface.

5. A high intensity light source arrangement, comprising:
   a luminary unit comprising a luminary circuit, at least a terminal electrically connected to said luminary circuit, and at least a luminary element electrifying with said terminal for emitting light;
   a heat dissipation unit which dissipates heat generated from said luminary unit;
   a base housing which comprises an electric input connector electrically connected to said luminary unit; and
   a converging element comprises a light housing for enclosing said luminary unit and a plurality of lens rings integrally formed on a peripheral wall of said light housing, wherein each of said lens rings is inclinedly extended at a diffraction angle for diverging a light beam from said luminary element to form a collimated light beam.

6. A high intensity light source arrangement, comprising:
   a luminary unit comprising a luminary circuit, at least a terminal electrically connected to said luminary circuit, and at least a luminary element electrifying with said terminal for emitting light;
   a heat dissipation unit which dissipates heat generated from said luminary unit;
   a base housing which comprises an electric input connector electrically connected to said luminary unit; and
   a lens body for covering said luminary unit to converge a light emitted from said luminary unit, said lens body has an illumination portion defining a light projecting surface and at least a diffraction portion defining a light diffraction surface inclinedly extended at a diffraction angle, wherein a diffraction density of said illumination portion is different from that of said diffraction portion, wherein a first portion of said light emitted from said luminary unit penetrates through said illumination portion to said light projecting surface thereof while a second portion of said light reach said light diffraction surface of said diffraction portion at an angle larger than said diffraction angle, said light is substantially reflected at said light diffraction surface back towards said light projecting surface, thus converging said light projected onto said light projecting surface.

7. A high intensity light source arrangement, comprising:
a luminary unit comprising a luminary circuit, at least a terminal electrically connected to the luminary circuit, and at least a luminary element adapted for electrifying with the terminal to emit light;
a heat dissipation unit supporting the luminary unit and dissipating heat generated from the luminary unit, wherein said heat dissipation unit has a supporting frame, and a dome integrally formed at a top end of said supporting frame, wherein said luminary circuit is correspondingly shaped to be securely mounted onto said dome for supporting said luminary element emitting in a multi-directional way; and
a base housing for supporting the heat dissipation unit thereon comprising an electric input connector electrically connecting to the luminary unit.

8. The high intensity light source arrangement, as recited in claim 7, wherein said dissipation unit further comprises a heat sink and a sealed chamber containing a predetermined volume of cooling agent which is capable of being vaporized by said heat generated from said luminary unit and being condensed by said heat sink so as to substantially transfer said heat from said luminary unit towards said heat sink.

9. The high intensity light source arrangement, as recited in claim 7, further comprising a converging element comprises a light housing for enclosing said luminary unit and a plurality of lens rings integrally formed on a peripheral wall of said light housing, wherein each of said lens rings is inclinedly extended at a diffraction angle for diverging a light beam from said luminary element to form a collimated light beam.

10. The high intensity light source arrangement, as recited in claim 7, further comprising a transparent light shelter for sealedly protecting said luminary unit.

11. A high intensity light source arrangement, comprising:
a luminary unit comprising a luminary circuit, at least a terminal electrically connected to the luminary circuit, and at least a luminary element adapted for electrifying with the terminal to emit light;
a heat dissipation unit supporting the luminary unit and dissipating heat generated from the luminary unit, wherein said heat dissipation unit has an elongated hollow supporting frame and a spherical shaped bulge integrally formed thereon, said luminary circuit is spherically shaped and overlappedly encasing said bulge for supporting said luminary element emitting in a multi-directional way; and
a base housing for supporting the heat dissipation unit thereon comprising an electric input connector electrically connecting to the luminary unit.

12. The high intensity light source arrangement, as recited in claim 11, wherein said dissipation unit further comprises a heat sink and a sealed chamber containing a predetermined volume of cooling agent which is capable of being vaporized by said heat generated from said luminary unit and being condensed by said heat sink so as to substantially transfer said heat from said luminary unit towards said heat sink.

13. A high intensity light source arrangement, comprising:
a luminary unit comprising a luminary circuit, at least a terminal electrically connected to the luminary circuit, and at least a luminary element adapted for electrifying with the terminal to emit light;
a heat dissipation unit supporting the luminary unit and dissipating heat generated from the luminary unit;
a base housing for supporting the heat dissipation unit thereon comprising an electric input connector electrically connecting to the luminary unit; and
a converging element comprises a light housing for enclosing said luminary unit and a plurality of lens ring integrally formed on a peripheral wall of said light housing, wherein each of said lens rings is inclinedly extended at a diffraction angle for diverging a light beam from said luminary element to form a collimated light beam.

* * * * *